United States Patent
Hanyu et al.

(10) Patent No.: US 11,133,046 B2
(45) Date of Patent: Sep. 28, 2021

(54) DATA WRITING DEVICE FOR VARIABLE-RESISTANCE MEMORY ELEMENT AND NON-VOLATILE FLIP-FLOP

(71) Applicant: TOHOKU UNIVERSITY, Sendai (JP)

(72) Inventors: Takahiro Hanyu, Sendai (JP); Daisuke Suzuki, Sendai (JP); Hideo Ohno, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/339,818

(22) PCT Filed: Oct. 31, 2017

(86) PCT No.: PCT/JP2017/039342
§ 371 (c)(1),
(2) Date: Dec. 26, 2019

(87) PCT Pub. No.: WO2018/079833
PCT Pub. Date: May 3, 2018

(65) Prior Publication Data
US 2020/0211611 A1    Jul. 2, 2020

(30) Foreign Application Priority Data
Oct. 31, 2016   (JP) .............................. JP2016-213779

(51) Int. Cl.
*G11C 11/16*    (2006.01)
*H01L 43/02*    (2006.01)

(52) U.S. Cl.
CPC ........ *G11C 11/1675* (2013.01); *G11C 11/161* (2013.01); *G11C 11/1673* (2013.01); *H01L 43/02* (2013.01)

(58) Field of Classification Search
CPC ................................................ G11C 11/1675
(Continued)

(56) References Cited

U.S. PATENT DOCUMENTS 9,412,446 B1 *  8/2016  Lohn .................. G11C 13/0069
2010/0271866 A1  10/2010  Sakimura et al.
(Continued)

FOREIGN PATENT DOCUMENTS

WO    2009/072511 A1    11/2000
WO    2015/147016 A1    10/2015
WO    2016/021468 A1    11/2016

OTHER PUBLICATIONS

Suzuki, Daisuke et al., "A Self-Terminated Energy-Efficient Non-volatile Flip-Flop Using 3-terminal Magnetic Tunnel Junction Device", Tohoku Uni. (Japan), 2016 International Conference on Solid State Devices and Materials, 3 pages.*
(Continued)

*Primary Examiner* — Muna A Techane
(74) *Attorney, Agent, or Firm* — Westerman, Hattori, Daniels & Adrian, LLP

(57) ABSTRACT

A data write device for a resistive memory element, the resistive memory element including: a conductive electrode provided at one end of the memory element; and a reading electrode provided at the other end of the memory element being configured to vary a resistance of the memory element by applying a write current to the conductive electrode, the data write device for the resistive memory element further includes: a writing means, an output means, and a control means. The output means is provided between a power supply and the reading electrode. As output signals, a read signal from the memory element and a monitor signal to monitor a writing status of the memory element written by the writing means are output from the output means. By the monitor signal, a termination of data-writing into the resistive memory element is detected.

5 Claims, 20 Drawing Sheets

(58) Field of Classification Search
USPC .......................................................... 365/158
See application file for complete search history.

(56) References Cited

U.S. PATENT DOCUMENTS

2016/0276027 A1\*  9/2016  Lin ..................... G11C 13/0069
2017/0222135 A1     8/2017  Fukami et al.
2017/0365338 A1    12/2017  Hanyu et al.

OTHER PUBLICATIONS

Suzuki, Daisuke et al., "A Compact Low-Power Nonvolatile Flip-Flop Using Domain-Wall-Motion-Device-Based Single-Ended Structure", IEICE Electronics Express, vol. \*, No. \* pp. 1-11, publicized Jun. 19, 2014.

Suzuki, Daisuke et al., "Magnetic-tunnel-junction based low-energy nonvolatile flip-flop using an area-efficient self-terminated write driver", Journal of Applied Physics 117, 17B504 (2015), pp. 17B504 to 17B504-3.

\* cited by examiner (a) Configuration (Structure)  (b) Resistance-Voltage characteristics
(R-I characteristics)

Resistive memory element
(3T-MTJ device)

(a)

(b)

(a) Present invention (b) Conventional configuration

Writing-termination detection unit
Completion detector

Writing-termination signal generation unit
Termination circuit

DONE  Writing-termination detection signal
WE    Writing-termination signal

Timing diagram of the NV-FF

Schematic of the proposed NV-FF

Conventional configuration of resistive memory element
(2T-MTJ-based
nonvolatile storage cell)

*1) : The number of iterations is 100.
*2) : Random patterns are used for the logic inputs and initial states of 3T-MTJ devices.
*3) : The width of the write current pulse is fixed to 12 ns.

DATA WRITING DEVICE FOR VARIABLE-RESISTANCE MEMORY ELEMENT AND NON-VOLATILE FLIP-FLOP

TECHNICAL FIELD

The present invention relates to a data write device for a resistive memory element and a non-volatile flip-flop.

BACKGROUND ART

A resistive memory element is a memory element that uses a resistance state affected by a writing current. The resistance-varying timing changes depending on the element; therefore, to vary the resistance of the memory element requires a sufficient time to apply a write current to a resistive memory element. The write current is continuously supplied to the memory element even after the resistance of the resistive memory element has been changed. The element has a problem in power consumption.

A technique to detect a termination of data-writing into a resistive memory element is proposed. A device detects a voltage change at an edge of the resistive memory element by switching a current direction depending on a write current. Based on the detected voltage change at the edge, the device detects a termination of data-writing (Patent literature 1).

In a non-volatile flip-flop using a resistive memory element, a non-volatile flip-flop (a self-terminated NV-FF) is proposed to suppress a backup current by detecting a voltage change at the time of switching operation of the resistive memory element and by terminating a apply of a write current (Non-patent literature 1).

The above-mentioned resistive memory element includes terminals for a write current at both ends of the memory element. In the resistive memory element, a direction of the write current is switched and the write current is supplied to the terminals. By contrast, another resistive memory element is proposed. The resistive memory element includes a conductive electrode at one end of a memory element varying its resistance and a reading electrode at the other side of the memory element. To apply a current to the conductive electrode leads to vary a resistance of the memory element (Patent literature 2).

FIG. 19 illustrates a configuration example of a conventionally known data write device for a resistive memory element.

A write device 100 includes a writing/monitor unit 120 which writes data into a resistive memory element 111 and monitors a writing status and a reading unit 130 which reads the data stored in the memory element 111.

The writing/monitor unit 120 includes a transistor 120Aa, a write driver 120Ab, a transistor 120Ba, and a write driver 120Bb to apply a write current to the memory element 111. The writing/monitor unit 120 supplies mutually reverse write currents to the memory element 111 and switches and outputs a terminal voltage (VM) of both ends of the memory element 111 by a multiplexer 121 to monitor a writing status.

A reading unit 130 is configured to connect a source of a PMOS transistor 130b to a power supply, connect a source of an NMOS transistor 130a to one end of the memory element 111, and connect a drain of the PMOS transistor 130b to a drain of the NMOS transistor 130a. The reading unit 130 outputs a read signal VRD from the last connecting point as an output terminal. The one end of the memory element 111 is grounded via an NMOS transistor 122. A read control signal RCL is input to a control terminal of the NMOS transistor 122.

CITATION LIST

Patent Literature

Patent literature 1: WO 2015/147016
Patent literature 2: WO 2009/072511
Patent literature 3: WO 2016/021468

Non-Patent Literature

Non-patent literature 1: D. Suzuki, et al., IEICE ELEX. 11 (2014) 20140296.
Non-patent literature 2: D. Suzuki, et al., J. Appl. Phys., 117 (2015) 17B504.

SUMMARY OF INVENTION

Technical Problem

No technique has been proposed for detecting a termination of data-writing into a resistive memory element which includes a conductive electrode at one end of a memory element and a reading electrode at the other side of the memory element, the resistive memory element configured for applying a current to the conductive electrode to vary a resistance in the memory element as shown in Patent Literature 2.

It is configurationally difficult to apply the detection technology of data-writing termination in a resistive memory element proposed in Patent literature 1 to another configuration of a resistive memory element shown in Patent literature 2. The resistive memory element shown in Patent literature 2 has a configuration to apply a write current to a conductive electrode provided at one end of the memory element to write data without conducting the write current to the memory element. Accordingly, no write current flows through the memory element during data-writing. Because a resistance change of the memory element is detected by using a current flowing through the memory element, it is configurationally impossible to apply a writing-termination detection technique shown in Patent literature 1 to another configuration of a resistive memory element shown in Patent literature 2 to detect a termination of data-writing based on a write current.

A purpose of the present invention is to solve the above-mentioned conventional problems and to detect a termination of data-writing into a resistive memory element, the resistive memory element including a conductive electrode provided at one end of a memory element varying its resistance and a reading electrode provided at the other side of the memory element, the resistive memory element configured to vary a resistance of the memory element by applying a write current to the conductive electrode.

Another purpose is to reduce power consumption in a backup operation by detecting a termination of data-writing into a resistive memory element to suppress a backup current.

Solution to Problem

A data write device for a resistive memory element of the present invention, the resistive memory element including: a conductive electrode provided at one end of a memory element varying its resistance; and a reading electrode provided at the other end of the memory element configured to vary a resistance of the memory element by applying a write current to the conductive electrode, the resistive memory element device further includes: a writing means, an output means, and a control means.

The writing means includes a driving means, the driving means switching a direction of the write current flowing to the conductive electrode to vary a resistance of the resistive memory element, the driving means configured to stop applying a write current.

The output means is provided between a power supply and the reading electrode of the memory element. As output signals, the output means outputs a read signal from the memory element and a monitor signal to monitor a writing status of the memory element.

The control means controls the driving means based on the monitor signal from the output means when data is written into the resistive memory element.

The device of the present invention has the output means between the power supply and the reading electrode. As output signals, the output means outputs a read signal from the memory element and a monitor signal to monitor a writing status of the memory element written by the writing means. According to this configuration in which the resistive memory element includes the conductive electrode at one end of a memory element varying its resistance and the reading electrode at the other side of the memory element and supplies a current to the conductive electrode to produce a resistance change of the memory element, a termination of data-writing into the resistive memory element is detected by the monitor signal.

According to a configuration of the present invention, the output means is provided between the power supply and the reading electrode to separate a current path for an output signal from a current path for a write current at the time of data-writing. Because of the configuration to separate a current path for an output signal from a current path for a write current, an output signal is independently output from a write current. Since a current path for an output signal is independent from a current path for a write current, the output signal can be obtained without effect of the write current.

The control means includes a writing-termination detection unit and a writing-termination signal generation unit.

The writing-termination detection unit detects a termination of data-writing based on two signals: a write signal from the writing means and a monitor signal from the output means. Based on these two signals, the writing-termination detection unit outputs a writing-termination detection signal. The writing-termination signal generation unit outputs a writing-termination signal based on a writing-termination detection signal from the writing-termination detection unit.

The writing-termination signal generation unit controls a driving means based on a generated writing-termination signal and terminates data-writing into the resistive memory element based on a monitor signal.

A configuration of the output means includes a series circuit of a PMOS transistor and an NMOS transistor. In this circuit configuration, a power supply is connected to a source end of the PMOS transistor and the reading electrode of the memory element is connected to a source end of the NMOS transistor. The connect node of a drain end of the PMOS transistor and a drain end of the NMOS transistor is an output terminal to output a read signal and a monitor signal.

In this configuration with a series circuit of a PMOS transistor and an NMOS transistor, a MOS transistor is used as a load resistance to output a resistance of the resistive memory element as a voltage signal. The connection node voltage of the PMOS transistor and the NMOS transistor corresponds to the intersection voltage of a load curve of the PMOS transistor and a voltage-current characteristic curve of the resistive memory element including the NMOS transistor. The connection node voltage is output as an output signal.

According to a configuration of the output means, the voltage-current characteristic curve of the resistive memory element side relates to a current flowing at the time of monitoring and is determined without restriction of a write current. Accordingly, it is possible to set a large voltage margin between these voltages to detect a different voltage in a writing status of the memory element. A large voltage margin to identify a detection voltage allows using a low sensitivity determination circuit to determine a writing status of the memory element. Moreover, this configuration enables a simplification and downsizing of a determination circuit.

Since a current path for a write current is separated from a current path for a read current, an output means and a writing means can be independently optimized; therefore, it is suitable for logic circuit design.

In a configuration of the driving means included in the writing means includes a first NMOS transistor connecting a source to one end of the conductive electrode and connecting a drain to a write current source side and a second NMOS transistor connecting a source to the other end of the conductive electrode and connecting a drain to a write current source side via an inverter. The driving means inputs a writing-termination signal from a control means to the first and the second NMOS transistor gates.

A configuration of the resistive memory element can use a resistive magnetic tunnel junction element (MTJ element) including three terminals as memory elements.

A data write device for a resistive memory element of the present invention can be applied to a non-volatile flip-flop by cascading a master latch and a slave latch to write data into the maser latch.

Advantageous Effects of Invention

As described above, a data write device for a resistive memory element of the present invention, the resistive memory element including: a conductive electrode provided at one end of a memory element varying its resistance; and a reading electrode provided at the other end of the memory element configured to vary a resistance of the memory element by applying a write current to the conductive electrode, the data write device for the resistive memory element further includes: a writing means, an output means, and a control means.

Moreover, a data write device for a resistive memory element of the present invention can reduce power consumption in backup operation and suppress a backup current by detecting a termination of data-writing into the resistive memory element.

DESCRIPTION OF THE EMBODIMENTS

Some embodiments of the present invention will be fully described below with reference to drawings.

Specifically, a schematic configuration and an operation example of a data write device for a resistive memory element of the present invention will be described with reference to FIGS. 1 and 2. A schematic configuration of a resistive memory element used for a data write device for a resistive memory element of the present invention and a configuration example of the resistive memory element will be described with reference to FIGS. 3 and 4. Next, a writing means and an output means included in a data write device for a resistive memory element of the present invention will be described with reference to FIGS. 5 and 6. FIG. 7 illustrates a control means. Some operation examples of a data write device will be described with reference to FIGS. 8 to 14.

Further, some configuration examples of a non-volatile flip-flop including a data write device for a resistive memory element of the present invention will be described with reference to FIGS. 15 to 18.

(Schematic Configuration and Operation of Data Write Device for Resistive Memory Element)

Figure 1:
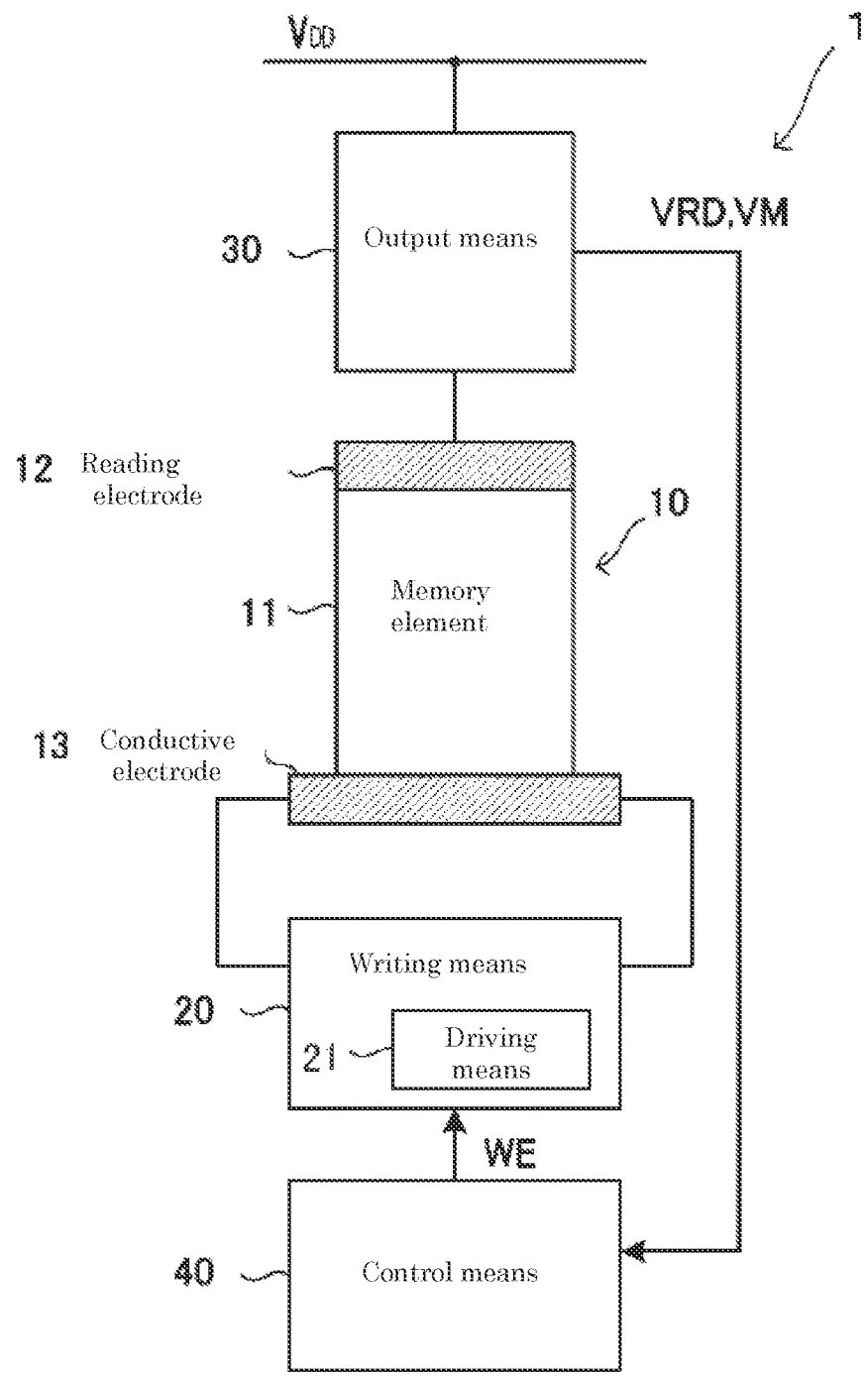
FIG. 1 is a block diagram illustrating a schematic configuration of a data write device for a resistive memory element of the present invention.

FIG. 1 is a schematic configuration illustrating a data write device for a resistive memory element of the present invention.

A data write device for a resistive memory element 1 includes a resistive memory element 10, a writing means 20, an output means 30, a control means 40.

The resistive memory element 10 includes a conductive electrode 13 at one end of a memory element 11 varying its resistance and a reading electrode 12 at the other end of the memory element 11. The memory element 11 varies a resistance by applying a write current to the conductive electrode 13 and memorizes data by associating a varied resistance with the data.

The writing means 20 includes a driving means 21 that switches a direction of a write current supplied to the conductive electrode 13 to vary a resistance of the resistive memory element 10 and to write data into the memory element 11.

The output means 30 is provided between a power supply (VDD) and the reading electrode 12 of the memory element 11 to output, as output signals, a read signal VRD from the memory element 11 and a monitor signal VM that monitors a writing status of the memory element 11.

The control means 40 controls the driving means 21 based on a monitor signal VM from the output means 30 when data is written into the resistive memory element 10. The control means 40 stops a apply of a write current based on a writing-termination detection.

The output means 30 is provided between the power supply (VDD) and the reading electrode 12 to output, as output signals, a read signal VRD from the memory element 11 and a monitor signal VM that monitors a writing status of the memory element 11 written by the writing means 20. To employ this configuration into a resistive memory element in which a current supplied to a conductive electrode varies resistance of the memory element, a monitor signal VM flows through a current path that is different from a write current path and detects a termination of data-writing into the memory element 11.

Current paths for output and writing will be described. The output means 30 provided between the power supply (VDD) and the reading electrode 12 forms a current path for extracting output signals (a read signal VRD and a monitor signal VM) through the power supply (VDD), the output means 30, the reading electrode 12, the memory element 11, and the conductive electrode 13 to ground. A write current path for data-writing is formed through the writing means 20, a terminal provided at one end of the conductive electrode 13, the conductive electrode 13, another terminal provided at the other end of the conductive electrode 13, and back to the writing means 20.

In this configuration, the current path for output signals and the current path for the write current are separated from each other and output signals and a write current are independently output without interference. The independent output of output signals from a write current enables outputs signal to be extracted without interference by a write current.

The control means 40 includes a writing-termination detection unit 41 and a writing-termination signal generation unit 42. The writing-termination detection unit 41 outputs a writing-termination detection signal DONE based on a write signal Y from the writing means 20 and a monitor signal VM from the output means 30 in a writing status. The writing-termination signal generation unit 42 outputs a writing-termination signal WE based on a writing-termination detection signal DONE from the writing-termination detection unit 41.

The writing-termination signal generation unit 42 controls the driving means 21 by the writing-termination signal WE which is generated to stop data-writing into the resistive memory element 10.

Next, operations of a data write device for a resistive memory element of the present invention will be described with reference to FIG. 2 and compared with operations of a conventional data write device for a resistive memory element. FIGS. 2(*a*) to 2(*c*) are operation diagrams illustrating an operation example of a data write device for a resistive memory element of the present invention. FIGS. 2(*d*) to 2(*f*) are operation diagrams illustrating an operation example of a data write device for a resistive memory element of the conventional configuration. FIG. 2 only illustrates a part of configurations illustrated in the schematic configuration of FIG. 1 and required for description of writing and reading operations. Other parts are omitted to be illustrated.

Figure 2:
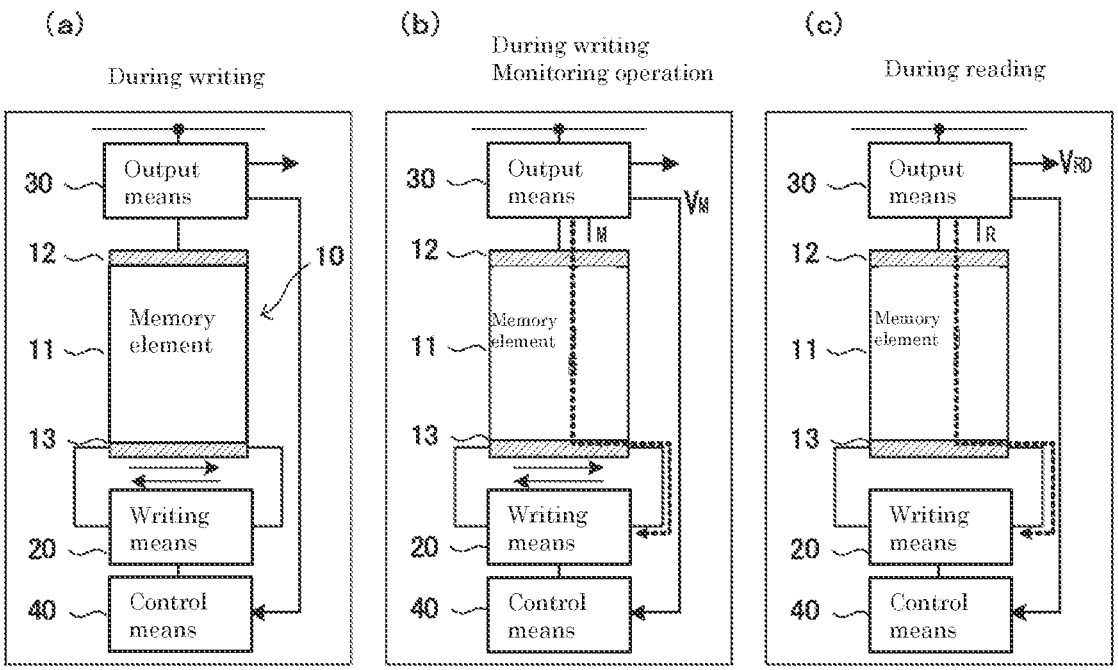
FIG. 2 is an operation diagram illustrating an operation example of a data write device for a resistive memory element of the present invention.
Figure 2:
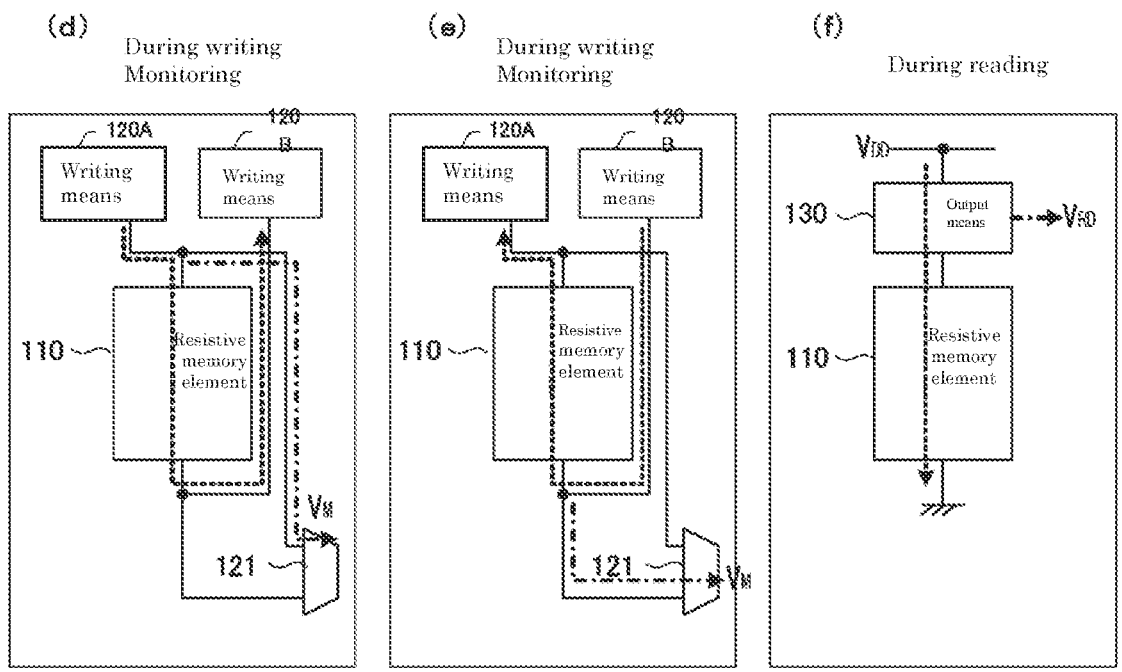

FIG. 2(*a*) illustrates a writing operation. When data is written, a writing means 20 supplies a write current to a conductive electrode 13 of a resistive memory element 10. A direction of the write current is switched depending on the data to be written. At this time, a current to acquire output signals does not flow through an output means 30 or a memory element 11.

FIG. 2(*b*) illustrates an operation example for monitoring a writing status of the memory element when data is written. When a writing status is monitored, a monitor current IM (a broken line in the figure) is supplied from an output means 30 through a reading electrode 12, a memory element 11, and a conductive electrode 13. The output means 30 outputs the monitor current IM and a monitor signal VM according to resistances of the memory element 11. Because the monitor signal VM is according to a resistance of memory element 11 and the resistance of the memory element 11 is based on data to be written, a writing status of the memory element is monitored based on the monitor signal VM.

FIG. 2(*c*) illustrates a reading operation status. When data is read, a read current IR (a broken line in the figure) is supplied from the output means 30 through the reading electrode 12, the memory element 11, and the conductive electrode 13. The output means 30 outputs a read signal VRD from a read current IR. Because the read signal VRD is according to a resistance of the memory element 11, a memory status of the memory element 11 is read based on the read signal VRD.

Figure 19:
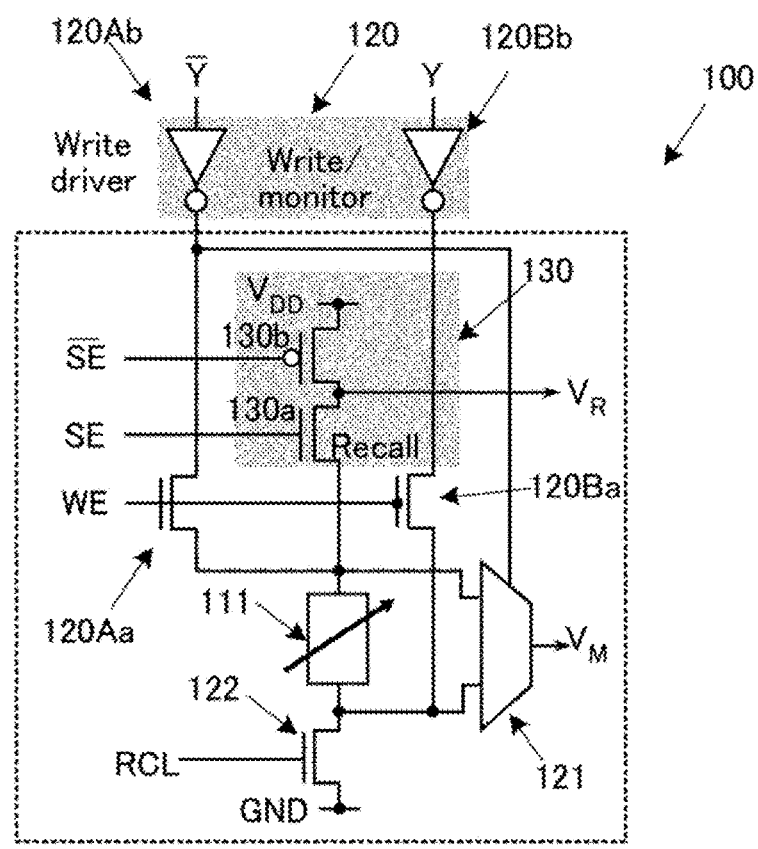
FIG. 19 is a schematic diagram illustrating a conventional data write device for a resistive memory element.

Operation status of a conventional data write device will be described with reference to FIGS. 2(*d*) to 2(*f*). In these Figures, the configuration in FIG. 19 is used as a configuration for a conventional data write device.

FIGS. 2(*d*) and 2(*e*) respectively illustrate a writing operation and a monitoring operation of a conventional write device. When data is written or a status is monitored, a write current is supplied from a writing means 120 A or a writing means 120 B to a resistive memory element 110. The write current is supplied from one of these writing means to the resistive memory element 110, then to the other writing means. At that time, a direction of the write current is selected depending on data to be written, either from the writing means 120 A to the writing means 120 B or from a writing means 120 B to a writing means 120 A.

A monitor detects a voltage across a terminal to which a current is supplied for the resistive memory element 110. The voltage is regarded as a monitor signal VM (a one-dot chain line in the figure). At this time, the monitor signal VM is selected by a multiplexer 121 depending on the direction of the write current according to an activated writing means.

FIG. 2(*f*) illustrates an operation status when data is read. When data is read, a read current IR (a broken line in the figure) is supplied from a reading unit 130 to the resistive memory element 110 to output a read signal VRD. Because the read signal VRD varies depending on a resistance of the resistive memory element 110, a memory status of the resistive memory element 110 is read according to the read signal VRD.

According to an embodiment of a write device of the present invention, a monitor signal VM is detected to monitor a writing status of a memory element by using a monitor current IM flowing through a current path independent from a write current path from a writing means. On the other hand, according to an embodiment of a conventional write device, a monitor signal VM is detected to monitor a writing status of a memory element by using a write current flowing through a write current path from a writing means. Because a monitor signal VM is detected at a different position depending on a direction of a write current, a multiplexer 121 is required to switch and output a monitor signal.

(Schematic Configuration of Resistive Memory Element)

Figure 3:
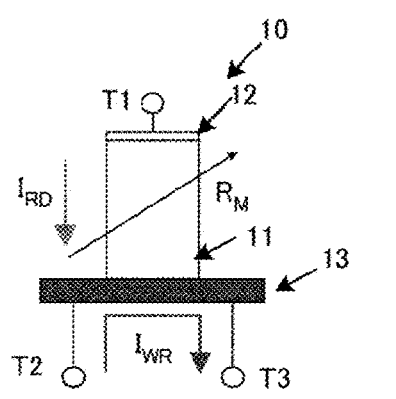
FIG. 3 is a diagram illustrating a schematic configuration of a resistive memory element used for a data write device for a resistive memory element of the present invention.
Figure 3:
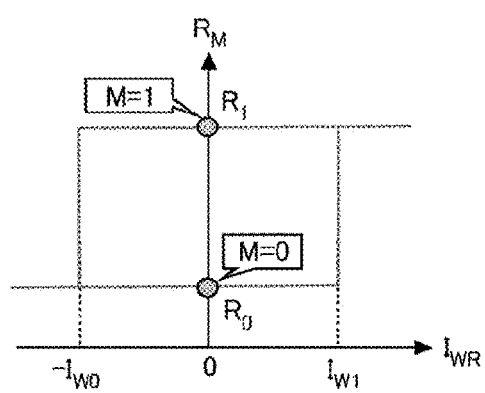

A configuration used for an embodiment of a resistive memory element 10 of the present invention will be described with reference to FIG. 3. FIG. 3(*a*) illustrates a schematic configuration of a resistive memory element 10. The resistive memory element 10 includes a conductive electrode 13 at one end of a memory element varying its resistance 11 and a reading electrode 12 at the other end of the memory element 11. A write current is supplied to the conductive electrode 13 to vary a resistance of the memory element 11.

The reading electrode 12 includes a terminal T1. The conductive electrode 13 includes two terminals T2 and T3. Accordingly, the resistive memory element 10 includes three terminals in total. Reversing a current direction of a magnetization reversal current flowing between T2 and T3 of the conductive electrode 13 changes a magnetization direction. The magnetization direction changes a resistance RM of the memory element 11.

FIG. 3(*b*) illustrates hysteresis characteristics of a write current IWR and a resistance RM of the memory element 11. When a resistance of the memory element 11 in the resistive memory element 10 is a high resistance R1, applying a write current IW1 changes the high resistance R1 to a low resistance R0. On the other hand, when a resistance of the memory element 11 in the resistive memory element 10 is a low resistance R0, applying a write current IW2 changes the low resistance R0 to a high resistance R1. For example, to respectively associate a high resistance R1 and a low resistance R0 with data M=1 and M=0 allows it to be usable as a memory element.

Writing data into the memory element 11 is performed by flowing a write current IWR between terminals T2 and T3. On the other hand, reading data in the memory element 11 is performed by detecting a voltage across a terminal T1 acquired by a read current IR.

(Configuration Example of Resistive Memory Element)

Next, schematic configuration examples of a resistive memory element will be described with reference to FIGS. 4(*a*) to 4(*d*). The schematic configurations of a resistive memory element shown below are examples and not limited to those configurations.

Figure 4:
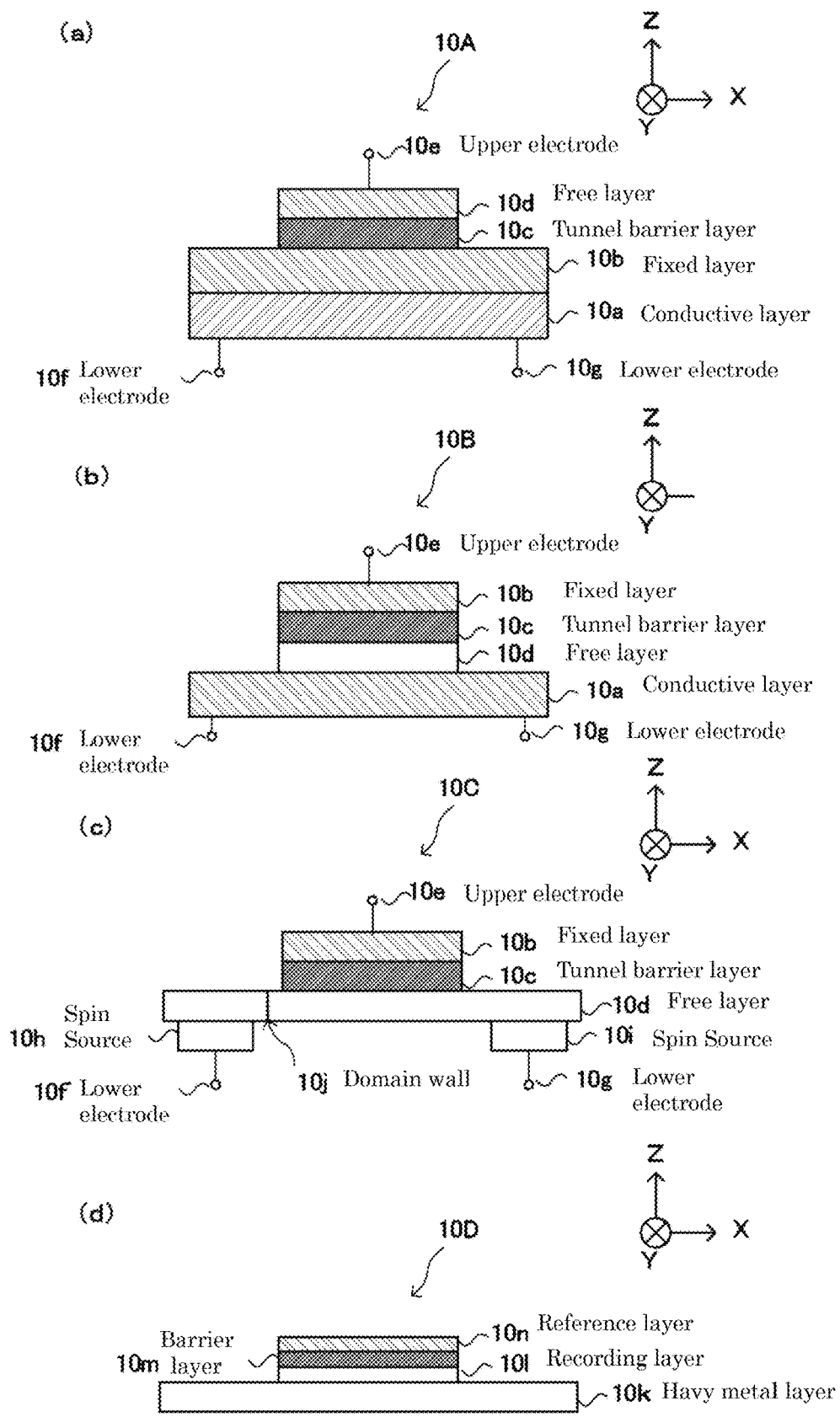
FIG. 4 is a schematic diagram illustrating a configuration example of a resistive memory element.

FIGS. 4(*a*) to 4(*d*) are schematic cross-sectional diagrams of resistive memory elements 10A, 10B, 10C, and 10D and show four schematic configurations. The configuration examples of the resistive memory element 10A to 10C refer to a schematic configuration described in Patent literature 2. They are configuration examples of MTJ element. The configuration example of the resistive memory element 10D refers to a configuration example described in Patent literature 3. It is a configuration example of magnetization reversal MTJ element using a spin-orbit-torque.

FIG. 4(*a*) is a cross-sectional diagram illustrating a configuration example of a resistive memory element 10A. A resistive memory element 10 includes a configuration to reverse a magnetization of a magnetization free layer using a magnetic field generated by a magnetization reversal current. In a configuration example of FIG. 4(*a*), the resistive memory element 10A includes a conductive layer 10a, a magnetization fixed layer 10b, a tunnel barrier layer 10c, and a magnetization free layer 10d. The magnetization fixed layer 10b is directly formed on the top surface of the conductive layer 10a. The tunnel barrier layer 10c is formed on the top surface of the magnetization fixed layer 10b. The magnetization free layer 10d is formed on the top surface of the tunnel barrier layer 10c. The magnetization fixed layer 10b is formed of a ferromagnetic film that fixes a magnetization. The magnetization free layer 10d is formed of a ferromagnetic film that reverses a magnetization. A terminal 10f of the resistive memory element 10A is provided in the vicinity of one end of the conductive layer 10a. A terminal 10g is provided in the vicinity of the other end of the conductive layer 10a. A terminal 10e of the resistive memory element 10A is provided on the top surface of the magnetization free layer 10d.

In the resistive memory element 10A, when a magnetization reversal current is supplied to the conductive layer 10a in +X direction, a magnetization field is applied to the magnetization free layer 10d in +Y direction. It parallelizes magnetization directions of the magnetization fixed layer 10b and the magnetization free layer 10d; further, the resistance of the resistive memory element 10A becomes low. By contrast, when a magnetization reversal current is supplied to the conductive layer 10a in −X direction, a magnetization field is applied to the magnetization free layer 10d in −Y direction. It anti-parallelizes magnetization directions of the magnetization fixed layer 10b and the magnetization free layer 10d, further, the resistance of the resistive memory element 10A becomes high.

FIG. 4(*b*) illustrates another configuration example. In the resistive memory element 10B, a magnetization free layer 10d is directly laminated on the top surface of a conductive layer 10a. A tunnel barrier layer 10c is laminated on the top surface of a magnetization free layer 10d. A magnetization fixed layer 10b may be laminated on the top surface of a tunnel barrier layer 10c. In the configurations of a resistive memory element 10A and 10B as illustrated in FIGS. 4(*a*) and 4(*b*), a conductive layer 10a corresponds to a conductive electrode of a resistive memory element of the present invention.

In FIG. 4C, a resistive memory element 10C is configured to be a domain wall displacement MTJ element that reverses a magnetization of a magnetization free layer by spin carried by electrons of a magnetization reversal current.

The resistive memory element 10C includes spin sources 10h and 10i, a magnetization free layer 10d, a tunnel barrier layer 10c, a magnetization fixed layer 10b. The spin sources 10h and 10i are joined under the magnetization free layer 10d and in the vicinity of both ends. The tunnel barrier layer 10c is laminated on the top surface of the magnetization free layer 10d. The magnetization fixed layer 10b is laminated on the top surface of the tunnel barrier layer 10c. The spin sources 10h and 10i, the magnetization free layer 10d, and the magnetization fixed layer 10b have vertical magnetization direction (Z direction). The magnetization of the magnetization fixed layer 10b is fixed in +Z direction. The magnetization of the spin source 10h is fixed in −Z direction. The magnetization of the spin source 10i is fixed in +Z direction. A domain wall 10j generates between the spin sources 10h and 10i to divide the magnetization of the magnetization free layer 10d into two areas. The upper and lower halves of the magnetization free layer 10d are respectively magnetized upward and downward.

In the resistive memory element 10C, when a magnetization reversal current is supplied in +X direction, spin-polarized electrons by the spin source 10h are injected into the magnetization free layer 10d. The spin-polarized electrons exert spin torque to move the domain wall 10j in −X direction until in the vicinity of the spin source 10h. As a result, a magnetization direction of the magnetization free layer 10d right under the magnetization fixed layer 10b becomes parallel to that of the magnetization fixed layer 10b; a resistance of the resistive memory element 10C becomes low. By contrast, when a magnetization reversal current is supplied in −X direction, the domain wall 10j provided in the vicinity of the spin source 10h moves in +X direction until in the vicinity of the spin source 10i. As a result, a magnetization direction of the magnetization free layer 10d right under the magnetization fixed layer 10b becomes unit-parallel to that of the magnetization fixed layer 10b; a resistance of the resistive memory element 10C becomes high. In the resistive memory element 10C illustrated in FIG. 4(*c*), the magnetization free layer 10d and below portion correspond to a conductive electrode of a resistive memory element of the present invention.

In FIG. 4(*d*), a resistive memory element 10D includes a heavy metal layer 10k made of heavy metal and extended in one direction, a recording layer 10l made of ferromagnetic material and provided adjacent to the heavy metal layer 10k, a barrier layer 10m made of an insulator and provided adjacent to the other surface of the heavy metal layer 10l opposite to the recording layer 10k, and a reference layer 10n made of ferromagnetic material and provided adjacent to the other surface of the heavy metal layer 10m opposite to the recording layer 10l.

A write current is supplied in a longitudinal direction of the heavy metal layer 10k (X axis direction) to generate spin that rewrites a magnetization direction of the recording layer 10l. The reference layer 10n is the layer of which the magnetization direction is fixed. In FIG. 4(*d*) illustrating a configuration of a resistive memory element 10D, a heavy metal layer 10k corresponds to a conductive electrode of a resistive memory element of the present invention.

An upper electrode of the resistive memory elements 10A to 10C corresponds to a reading electrode of a resistive memory element of the present invention. The resistive memory element 10D does not specify the portion corresponding to a reading electrode of a resistive memory element of the present invention, however, the electrode provided on the opposite end to the memory element may correspond to a reading electrode.

(Configuration of Writing Means and Output Means)

A writing means 20 and an output means 30 in a write device of the present invention will be described with reference to a schematic configuration of FIG. 5.

The writing means 20 includes driving means 21A and 21B which apply a write current to a conductive electrode 13 of the resistive memory element 10, and a control unit 22 which forms a write signal Y to write data into the driving means 21A and 21B. In FIG. 5, a write signal to the driving means 21A is illustrated as a write signal Y output from the inverter 22b of the control unit 22 while a write signal to the driving means 21B is illustrated as a write signal output from NAND circuit 22a of the control unit 22. In this configuration, these write signals has values inverted by the inverter 22b. To detect a writing status, it is sufficient to detect a write signal Y only.

The control unit 22 includes a NAND circuit 22a and an inverter 22b. An output terminal of the inverter 22b is connected to a driving means 21A. An input terminal of the inverter 22b is connected to a driving means 21B.

A data signal Nq and a backup signal BCK are input in the NAND circuit 22a. The backup signal BCK is a signal for executing a processing after data-writing. The data signal Nq is a signal generated to synchronize with a clock CLK to write data D. The NAND circuit 22a outputs "High" when both the backup signal BCK and the data signal Nq are "Low" or when either the backup signal BCK or the data signal Nq is "Low" and the other signal is "High". The NAND 22a outputs "Low" when both the backup signal BCK and the data signal Nq are "High". The inverter 22b inverts the output from the NAND circuit 22a to output the inversed result.

The driving means 21A includes an inverter 21Ab and an NMOS transistor 21Aa. An input terminal of the inverter 21Ab is connected to the inverter 22b of the control unit 22. a drain of the NMOS transistor 21Aa is connected to an output terminal of the inverter 21Ab. The source of the NMOS transistor 21Aa is connected to an end of the conductive electrode 13. The inverter 21Ab supplies a write current to one end of the conductive electrode 13 based on a write signal Y input from the inverter 22b of the control unit 22. The NMOS transistor 21Aa is turned off to terminate a writing operation upon receiving a writing-termination signal WE.

By contrast, the driving means 21B includes an inverter 21Bb and an NMOS transistor 21Ba. An input terminal of the inverter 21Bb is connected to an output terminal of the NAND circuit 22a of the control unit 22. A drain of the NMOS transistor 21Ba is connected to an output terminal of the inverter 21Bb. A source of the NMOS transistor 21B is connected to the other end of the conductive electrode 13. The inverter 21Bb supplies a write current to the other end of the conductive electrode 13 based on a write signal input from the NAND circuit 22a of the control unit 22. The driving means 21A is connected to one end of the conductive electrode 13. The driving means 21B is connected to the other end of the conductive electrode 13. The driving means 21A and 21B exclusively drives based on write signals from the control unit 22 and changes a direction to apply a write current to the conductive electrode 13. The NMOS transistor 21Ba turns off to terminate a writing operation upon receiving a writing-termination signal WE. An end of the conductive electrode 13 is grounded via the NMOS transistor 31. A read control signal RCL is input to a control terminal of the NMOS transistor 31. An end of the conductive electrode 13 is grounded when data is read.

A driving means 21 in FIG. 5(b) illustrates a configuration example of driving means 21A and 21B. In the driving means 21, an output terminal of an inverter 21I is connected to a drain of an NMOS transistor 21o. A writing-termination signal WE is input to a control terminal of the NMOS transistor 21o.

A drain of a PMOS transistor 21p and a drain of an NMOS transistor 21n connect as output terminal of the inverter 21I. A source of the PMOS transistor 21p is connected to a power supply. A source of the NMOS transistor 21n is grounded. A control terminal of the PMOS transistor 21p and a control terminal of the NMOS transistor 21n are connected as input terminals of the inverter 21I.

For example, when data is written, a write signal Y is input to a driving means 21A and the inversion signal of Y is input to the driving means 21B, or an inversion signal of Y is input to a driving means 21A and the write signal Y is input to the driving means 21B. In the driving means 21, a "High" write signal Y or a "High" inversion signal of Y turns ON the NMOS transistor 21n and turns OFF the PMOS transistor 21p. Because the transistor 21o is ON due to a "High" writing-termination signal WE, a write current IWR is passed through the conductive electrode 13 and grounded via a transistor 21a and the inverter 21I of the NMOS transistor 21n.

An embodiment of an output means 30 is configured to have a PMOS transistor 30b and NMOS transistor 30a connected in series. In this configuration circuit, a source terminal of the PMOS transistor 30b is connected to a power supply (VDD); a source terminal of the NMOS transistor 30a is connected to a reading electrode 12 of the memory element 11. The connected node of a drain terminal of the PMOS transistor 30b and a drain terminal of the NMOS transistor 30a is an output terminal to output a read signal VRD and a monitor signal VM.

An inversion signal of a monitor control signal SE is input to a control terminal of the PMOS transistor 30b connected to the power supply voltage VDD side. A monitor control signal SE is input to a control terminal of the NMOS transistor 30a connected to a reading electrode 12 of the memory element 11. A read signal VRD and VM (signal A) are output using a connection point of two transistors (PMOS transistor 30b and NMOS transistor 30a) as output terminals.

In output means 30, when the monitor control signal SE is "High", the PMOS transistor 30b is OFF and the NMOS transistor 30a is ON; therefore, the output terminal outputs a read signal VRD and a monitor signal VM with voltage according to the resistance of the memory element 11. By contrast, when the monitor control signal SE is "Low", the PMOS transistor 30b is ON and the NMOS transistor 30a is OFF; therefore, the output terminal outputs a power supply voltage VDD.

In the circuit configuration of the PMOS transistor 30b and the NMOS transistor 30a connected in series, a resistance of the resistive memory element is output as voltage by using the PMOS transistor 30b as load resistance. The voltage at the connection node of the PMOS transistor 30b and the NMOS transistor 30a corresponds to the voltage at the connection node of a load curve of the PMOS transistor 30b and a voltage-current characteristic curve of a resistive memory element including the NMOS transistor 30a. The voltage at the connection is output as an output signal.

According to this configuration of the output means 30, a voltage-current characteristic curve at the resistive memory element side relates to a current flowing at the time of monitoring and can be determined without restriction by a write current. Accordingly, the configuration enables a detection voltage to have a large margin without restriction of a write current to identify the difference of a write voltage in the memory element.

Figure 6:
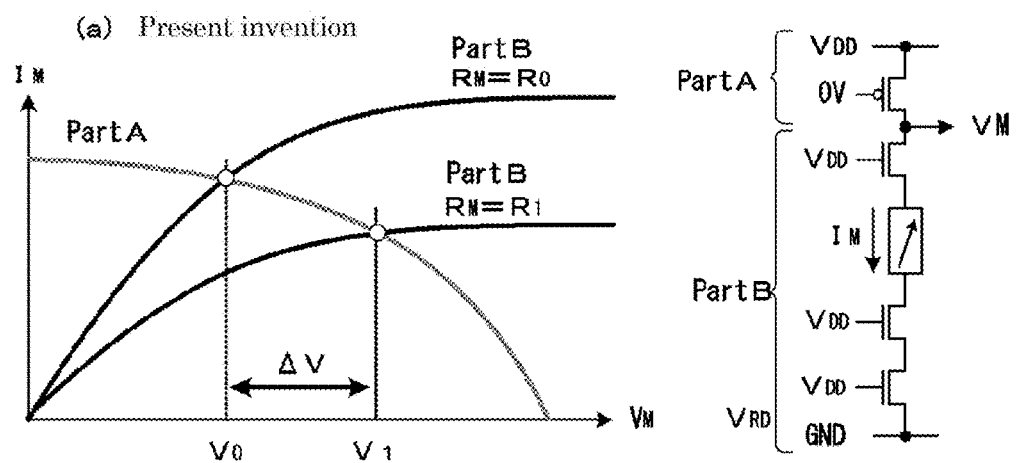
FIG. 6 is a diagram comparing a detection voltage margin of an output means of the present invention with a detection voltage margin used for a conventional resistive memory element.
Figure 6:
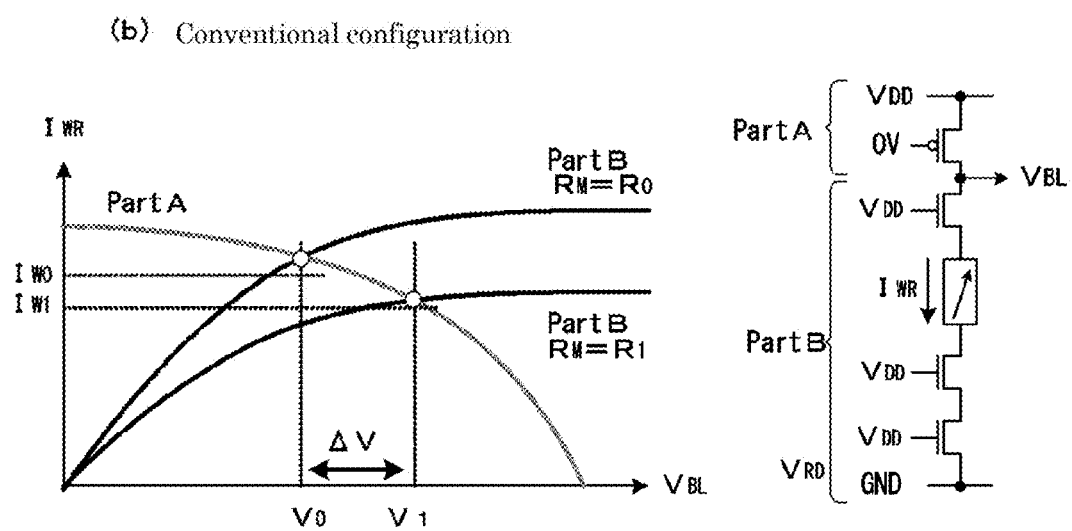
Figure 7:
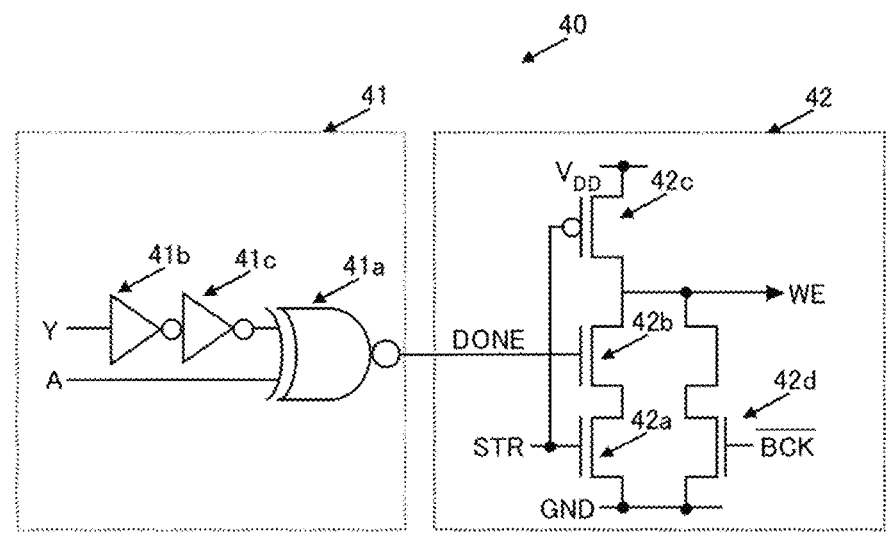
FIG. 7 is a diagram illustrating a control means of the present invention.

FIG. 6 is a diagram illustrating margins of detection voltage to identify a difference in voltage during writing data to a memory element. FIGS. 6(a) and 6(b) respectively illustrate a case in which a write device of the present invention is used and a case in which a conventional write device is used.

In FIGS. 6(a) and 6(b), a right circuit illustrates a schematic circuit configuration of a memory element and an output means; a left graph illustrates a load characteristic curve and a voltage-current characteristic curve. This configuration is divided at an output terminal into two parts: parts A and B. The part A corresponds to a PMOS transistor and is a load resistance. The part B corresponds to a memory element and an NMOS transistor.

Because a common current is supplied to the parts A and B, a voltage of an output terminal is regarded as a voltage at the intersection of a load characteristic curve of the part A and a voltage-current characteristic curve of the part B.

FIG. 6(a) illustrates a relation of a monitor current IM and a monitor signal VM at the time of monitoring using a load characteristic curve of the part A and a voltage-current characteristic curve of the part B.

Voltage-current characteristic curves of the part B respectively illustrate cases when a resistance RM of written memory element is low R0 and high R1. The voltages defined at the intersection with the load characteristic curve of the part A are output as monitor signals VM. When the resistance RM of the memory element is low R0, voltage V0 is output as a monitor signal VM. When the resistance RM of the memory element is high R1, voltage V1 is output as a monitor signal VM.

The writing status of the memory element is determined by whether the voltage of the monitor signal VM is V0 or V1. The larger the voltage difference ΔV between V0 and V1 is and the larger the voltage margin is, the easier to determine the monitor signal VM using a determination circuit with low sensitivity. On the other hand, the smaller the voltage difference ΔV between V0 and V1 is and the smaller the voltage margin is, the more difficult to determine the monitor signal VM, further, a determination circuit with high sensitivity is required.

Because the load characteristic curve of the part A can be changed by a monitor current IM, the margin of the voltage difference ΔV between V0 and V1 can be freely determined. Increasing the margin enables a determination circuit with low sensitivity to be used for determination of the writing status of the memory element, further, contributes to simplification and downsizing of a determination circuit configuration.

In FIG. 6(b) illustrating a conventional configuration, a load characteristic curve of the part A and voltage-current characteristic curves of the part B show a relation between a write current IWR and a write signal VBL when data is written.

Same as in FIG. 6(a), the voltage-current characteristic curves of the part B in FIG. 6(b) respectively illustrate cases when a resistance RM of written memory element is low R0 and high R1. The voltages defined at the intersection with the load characteristic curve of the part A are output as a write signal VBL. When the resistance RM of the memory element is low R0, voltage V0 is output as a monitor signal VM. When the resistance RM of the memory element is high R1, voltage V1 is output as a monitor signal VM.

In a conventional configuration, an intersection of a load characteristic curve of the part A and a voltage-current characteristic curve of the part B is restricted by a write current. Writing data into the memory element requires a write current exceeding a predetermined value. The required write current is different depending on a resistance of the memory element.

For example, in order to set a resistance RM of the memory element to be low resistance R0, a current more than a write current IW0 is required. To set a resistance RM of the memory element to be high resistance R1, more current than a write current IW1 is required. Therefore, in the conventional configuration, the connection of a load characteristic curve of the part A and a voltage-current characteristic curve of the part B is restricted by a write current. In addition, the voltage V0 to write a low resistance R0 and the voltage V1 to write a high resistance R1 are respectively restricted by a write current IW0 and a write current IW1.

Consequently, it is difficult to set a large voltage difference ΔV between the voltage V0 to determine a low resistance R0 and the voltage V1 to determine a high resistance R1 in order to determine a writing status; further, the voltage margin is small. The smaller voltage margin is, the higher sensibility is required for determination circuit. Therefore, the circuit configuration becomes large.

(Configuration of Control Means)

FIG. 7 is a diagram illustrating a configuration example of a control means 40 of the present invention.

The control means 40 includes a writing-termination detection unit 41 and a writing-termination signal generation unit 42. The writing-termination detection unit 41 includes an exclusive NOR 41a and even number of inverters 41b and 41c. A write signal Y is input from a control unit 22 to one input terminal of the exclusive NOR 41a via the even number of inverters 41b and 41c. A monitor signal VM (signal A) is input from an output means 30 to the other input terminal. The writing-termination detection unit 41 detects a termination of data-writing into the memory element 11 based on a matching of a write signal Y from the control unit 22 and a signal A from the output means 30. The writing-termination detection unit 41 outputs a writing-termination detection signal DONE.

The writing-termination signal generation unit 42 is a circuit for generating a writing-termination signal WE based on a writing-termination detection signal DONE from the writing-termination detection unit 41. The writing-termination signal generation unit 42 includes a serial circuit and a parallel circuit. The serial circuit has three transistors 42a, 42b, and 42c serially connected between a power supply voltage VDD and a ground voltage GND. The parallel circuit is parallelly connected with a serial circuit of a transistor 42a and a transistor 42b. Here, the transistor 42a may be a PMOS transistor while transistors 42b, 42c, and 42d may be NMOS transistors.

A writing-termination detection signal DONE, which is an output signal from the writing-termination detection unit 41, is input to a control gate of the transistor 42b. A backup starting control signal STR is input to control gates of the transistor 42a and 42c. Transistors 42a and 42c are operated having an inverted value to each other and turns ON and OFF in an opposite direction with respect to an input of a backup starting control signal STR.

The backup starting control signal STR becomes "Low" at the time of switching from a normal operation to a backup operation, then becomes "High" after one clock cycle and starts a backup operation.

When the backup operation is started, a writing-termination detection signal DONE is "Low" and a writing-termination detection signal DONE is "Low". To switch the backup starting control signal STR from "Low" to "High", the transistor 42c and the transistor 32a are respectively turn OFF and ON. In this circumstance, when a monitor signal VM from the output means 30 switches the signal A to "High" as well as a write signal Y becomes "High", the writing-termination detection unit 41 switches a writing-termination detection signal DONE to "High". Upon receiving a "High" writing-termination detection signal DONE, the transistor 42b becomes "High" and the transistors 42b and 42c are turned to ON. A potential of the connection terminal of a drain of the transistor 42c and a drain of the transistor 42b becomes a ground potential to output a "Low" writing-termination signal WE.

While no backup operation is performed, the transistor 42d is turned to ON by an inversion BCK inverted from a backup signal BCK to output a "Low" writing-termination signal WE. The transistor 21Aa of the driving means 21A and the transistor 21Ba of the driving means 21B are turned to OFF by the "Low" writing-termination signal WE to terminate data-writing.

(Operation Examples)

Figure 11:
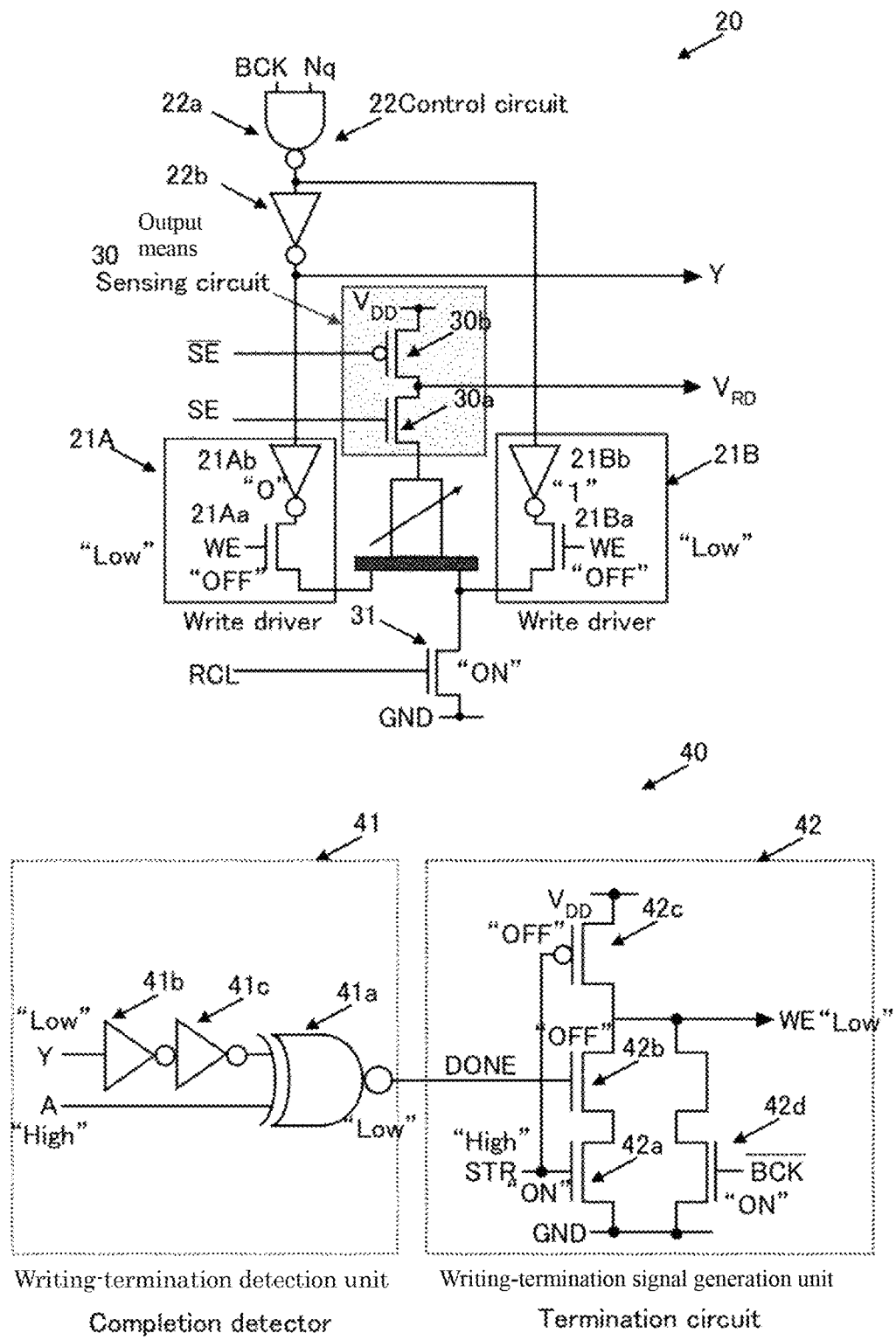
FIG. 11 is an operation diagram illustrating an operation example of a data write device for a resistive memory element of the present invention.
Figure 12:
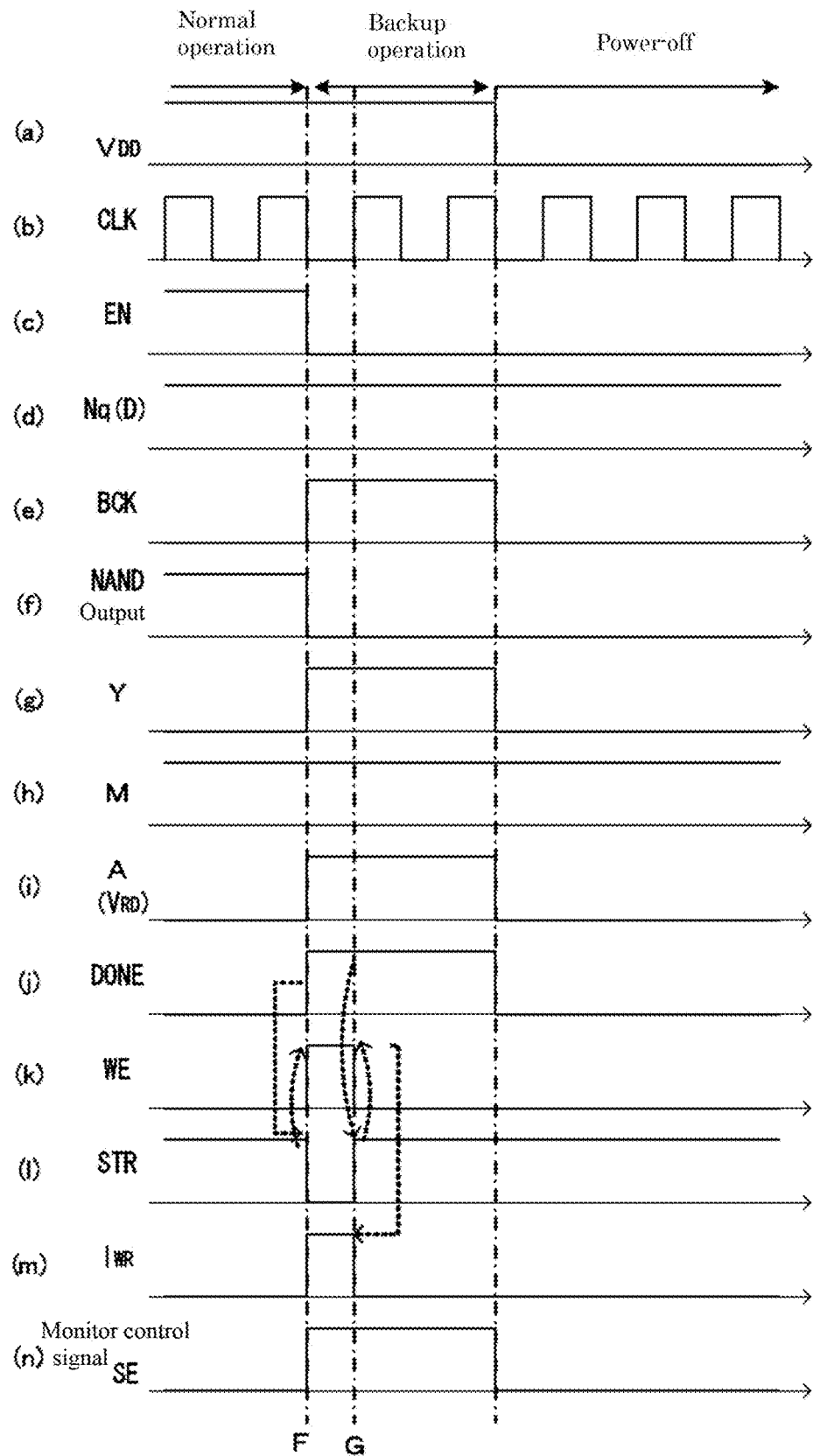
FIG. 12 is a timing chart illustrating an operation example of a data write device for a resistive memory element of the present invention.
Figure 13:
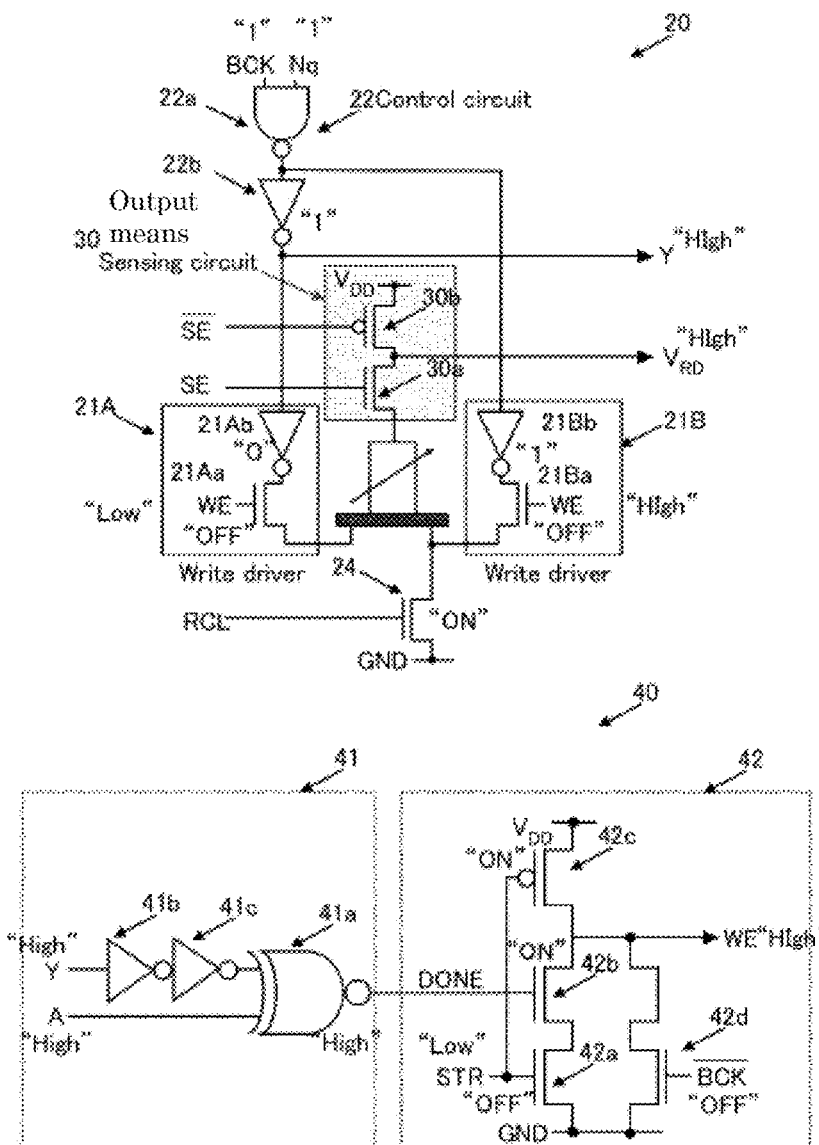
FIG. 13 is an operation diagram illustrating an operation example of a data write device for a resistive memory element of the present invention.
Figure 14:
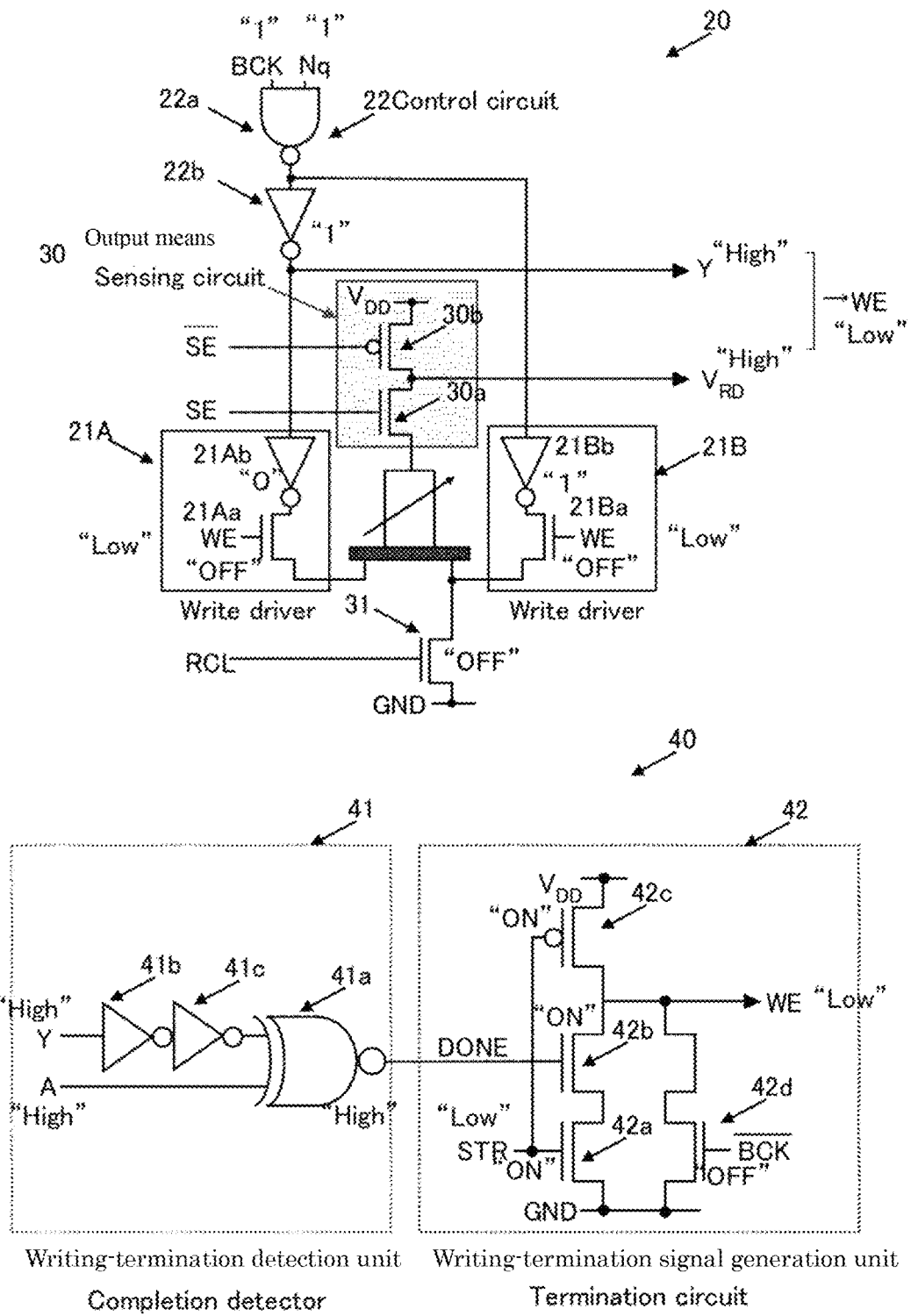
FIG. 14 is an operation diagram illustrating an operation example of a data write device for a resistive memory element of the present invention.

Operation examples of a data write device for a resistive memory element of the present invention will be described with reference to FIGS. 8 to 14. FIGS. 8 to 11 illustrate a backup operation status 1, in which data before writing is different from data after writing, or data is rewritten to have a different value. FIGS. 12 to 14 illustrate a backup operation status 2, in which data before writing is the same as data after writing, or the data is not rewritten.

Backup Operation Status 1

Figure 8:
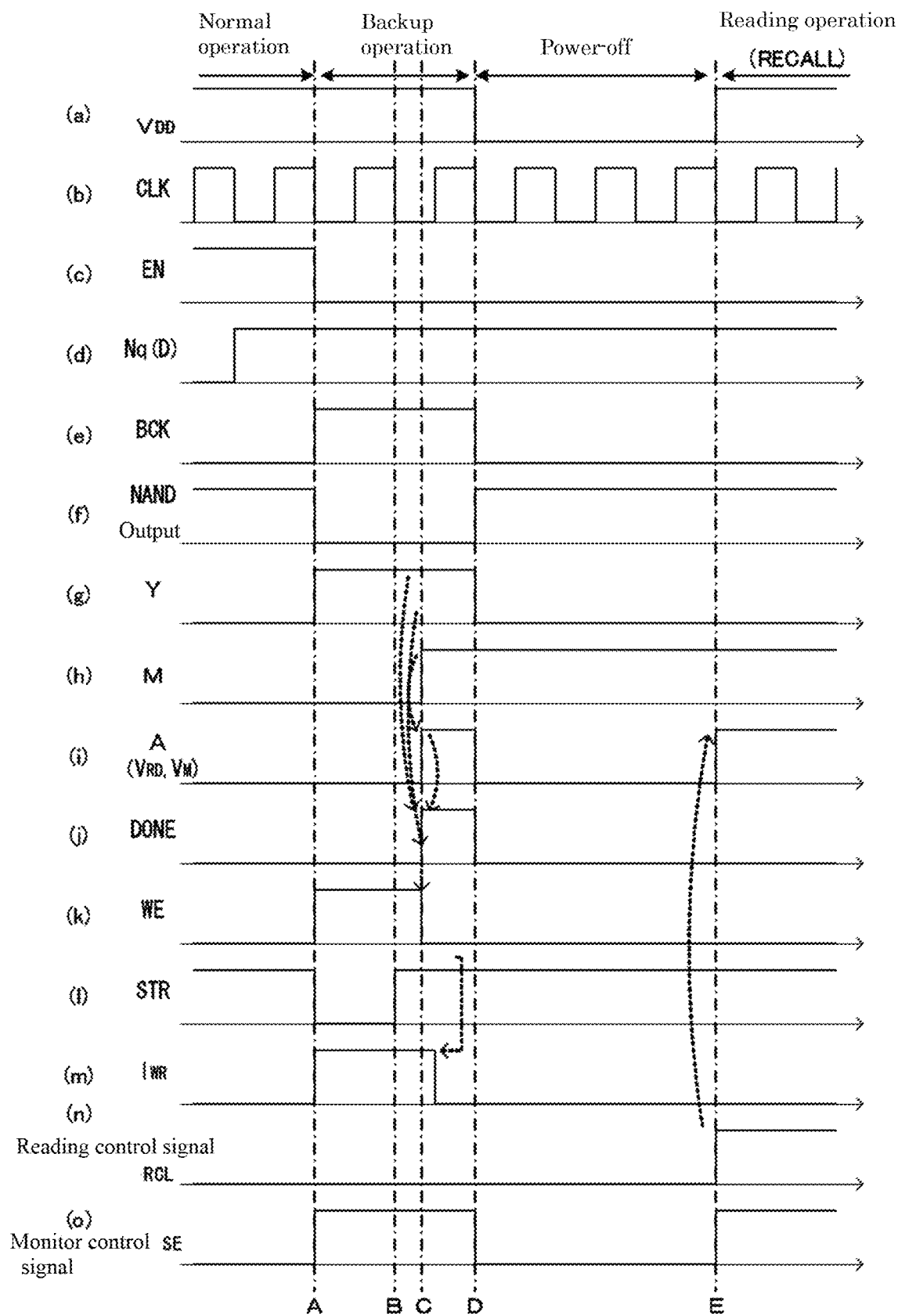
FIG. 8 is a timing chart illustrating an operation example of a data write device for a resistive memory element of the present invention.

A timing chart of FIG. 8 illustrates a normal operation, a backup operation, a power-off period, and a reading operation. The normal operation indicates an operation without data-writing; the backup operation indicates an operation to write data and to monitor data-writing; the power off period indicates a period during which no power is supplied to a memory element; and the reading operation indicates an operation to read data stored in the memory element.

FIG. 8(a) illustrates a power supply VDD. FIG. 8(b) illustrates a clock CLK. FIG. 8(c) illustrates an enable signal EN to enable a normal operation. FIG. 8(d) illustrates a data signal Nq. FIG. 8(e) illustrates a backup signal BCK to enable a backup operation. FIG. 8(f) illustrates a NAND output from a control unit 22. FIG. 8(g) illustrates a write signal Y output from the control unit 22. FIG. 8(h) illustrates a memory status of a memory element 11. FIG. 8(i) illustrates output signals A (a read signal VRD and a monitor signal VM) from an output means 30. FIG. 8(j) illustrates a writing-termination detection signal DONE to detect a termination of data-writing into the memory element. FIG. 8(k) illustrates a writing-termination signal WE to terminate a write current. FIG. 8(l) illustrates a backup starting control signal STR to start a backup operation. FIG. 8(m) illustrates a current IWR to write data to the memory element. FIG. 8(n) illustrates a read control signal RCL to control a reading operation. FIG. 8(o) illustrates a monitor control signal SE to enable a monitor operation.

(Normal Operation)

In the normal operation, an enable signal EN is "High"; an operation similar to that of a CMOS flip-flop is performed; and data is not written into the memory element. Here, a resistance of the memory element 11 is "Low"; a write signal Y and an output signal A are "Low"; a writing-termination detection signal DONE is "Low". If any of clocks CLK falls during the normal operation, a data signal Nq transits from "Low" to "High".

(Backup Operation)

Figure 9:
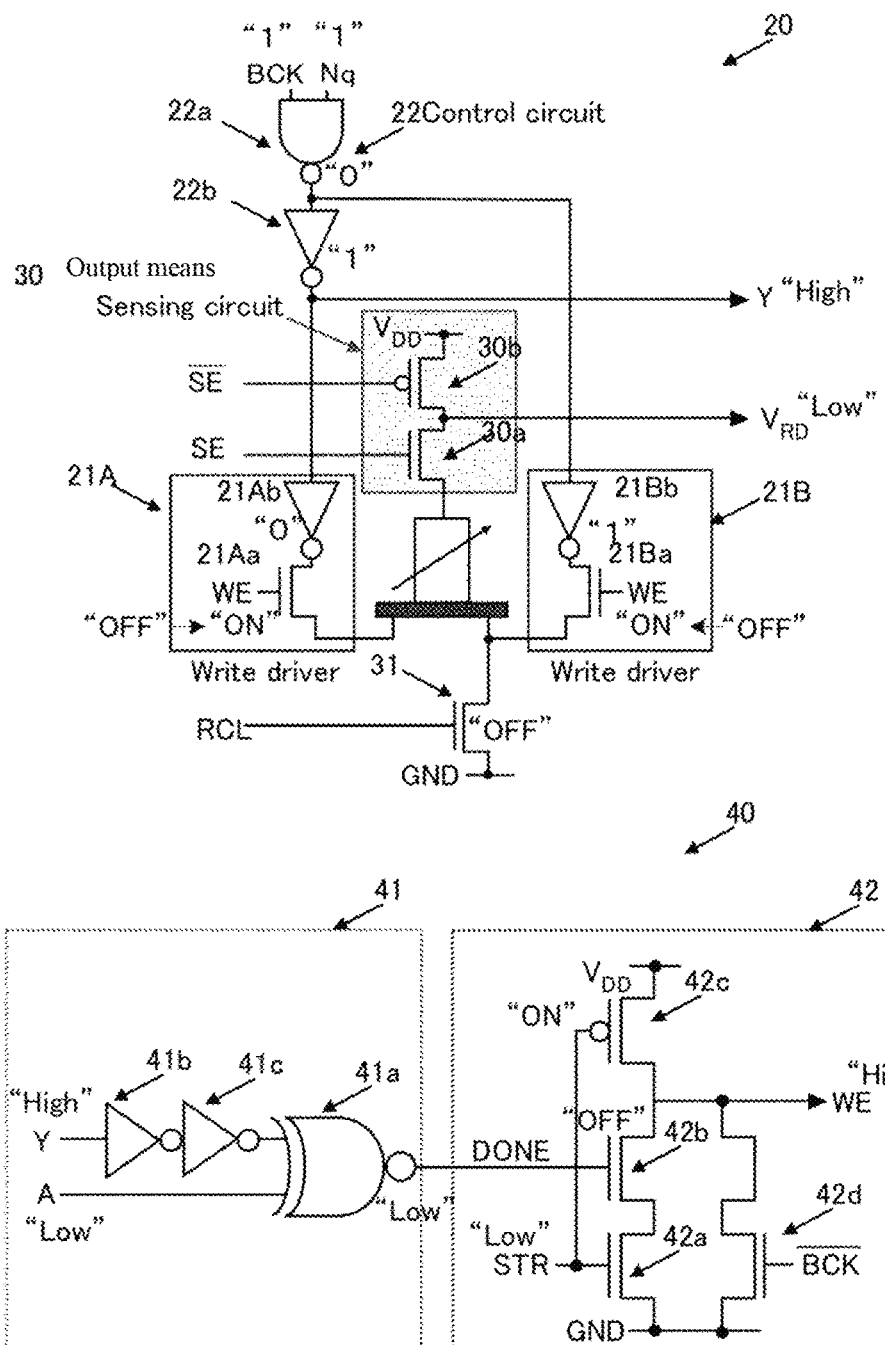
FIG. 9 is an operation diagram illustrating an operation example of a data write device for a resistive memory element of the present invention.
Figure 10:
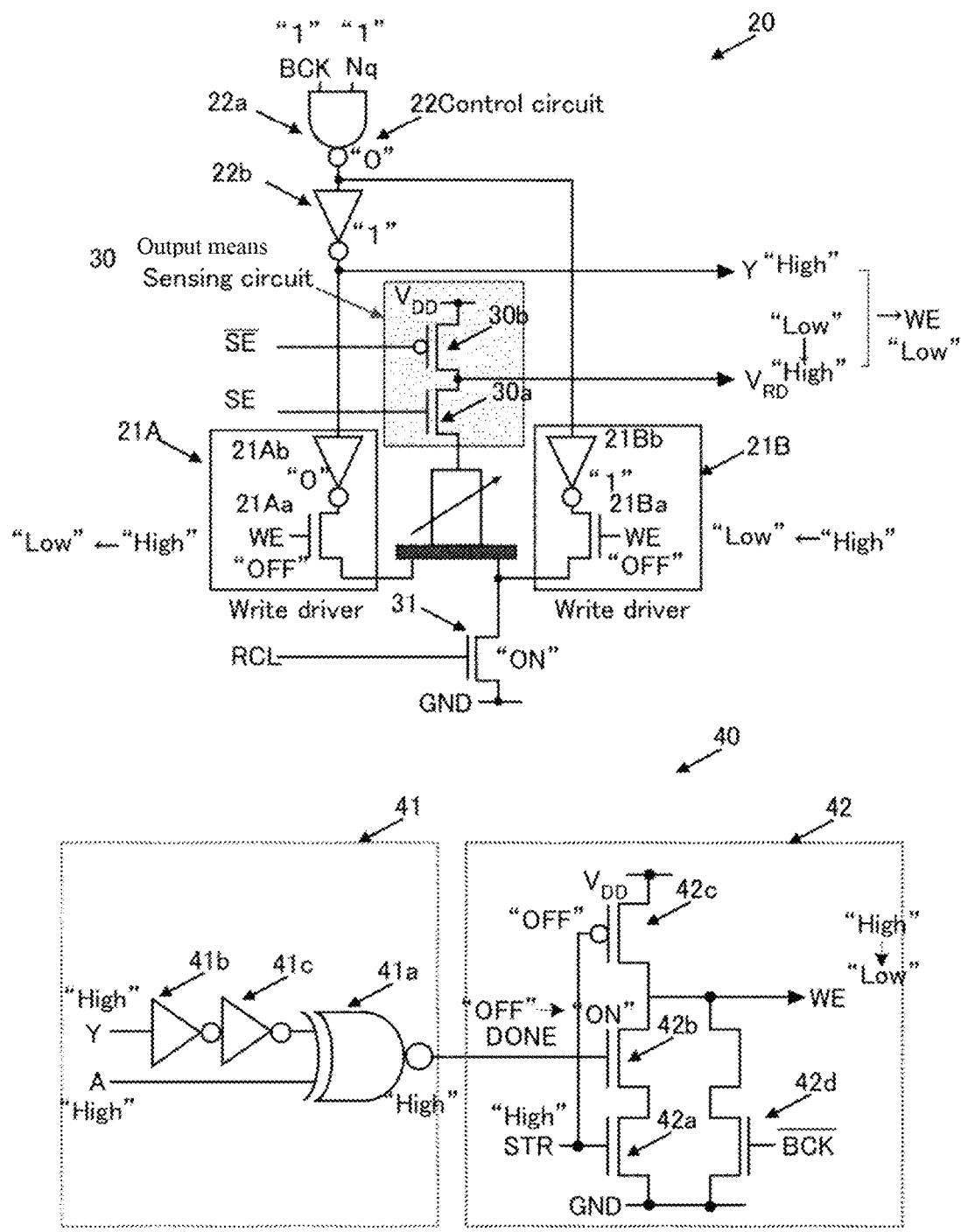
FIG. 10 is an operation diagram illustrating an operation example of a data write device for a resistive memory element of the present invention.

FIG. 9 and FIG. 10 illustrate operation examples of a writing means 20, an output means 30, and a control means 40 in a backup operation.

(At Point of Time A) The point A in FIG. 8 indicates a time at which a normal operation is changed to a backup operation. FIG. 9 illustrates an operation status at this point. A data-writing is started by changing an enable signal EN from "High" to "Low". A backup operation is started by changing a backup signal BCK from "Low" to "High".

A backup signal BCK and a data signal Nq are input to a NAND 22a. Transition of the backup signal BCK changes a NAND output to "Low" and a write signal Y is output from an inverter 22b. An inversion signal of the backup signal BCK transits to "High" in the control means 40, which turns ON a transistor 42d, transits a writing-termination signal WE to "High", and enables a writing operation.

Respective transistors 21Aa and 21Ba of driving means 21A and 21B are turned ON from OFF by a writing-termination signal WE from the output means 30. A write current IWR is supplied to a conductive electrode 13 of a resistive memory element 10.

Transistors 30a and 30b of the output means 30 are ON. A transistor 31 is switched to ON by rising a monitor control signal SE. Because the resistance is low, an output signal A is "Low".

While a write signal Y is "High", an output signal A is "Low". Accordingly, a writing-termination detection signal DONE remains "Low" while a writing-termination signal WE remains "High"; and a writing termination control is not performed.

(At Point of Time B) The point B in FIG. 8 indicates a time at which a backup starting control signal STR that is "Low" at a start of a backup operation is changed to "High" after one clock cycle.

In a writing-termination signal generation unit 42, a transistor 42a is turned ON and a transistor 42c is turned OFF by changing a backup starting control signal STR to "High". At that time, a writing-termination detection signal DONE is "Low". Accordingly, a transistor 42b is OFF and a writing-termination signal WE is "High".

(At Point of Time C) The point C in FIG. 8 indicates a time at which a resistance of a memory element 11 (data M) varies in a backup operation. FIG. 10 illustrates the operation status at this point of time.

When the resistance of the memory element 11 (data M) varies from "Low" to "High", an output signal A is changed from "Low" to "High" depending on this change. The change in the output signal A leads to a change in a writing-termination detection signal DONE from the writing-termination detection unit 41 to "High". Receiving the writing-termination detection signal DONE, the transistor 42b of the writing-termination signal generation unit 42 turns ON; a writing-termination signal WE transits from "High" to "Low".

By transiting a writing-termination signal WE from "High" to "Low", respective transistors 21Aa and 21Ba of driving means 21A and 21B are turned OFF and apply of a write current IWR is stopped.

(Power Off Period)

(At Point of Time D) The point D in FIG. 8 indicates a time at which a backup operation is change to a power OFF. This operation is performed when a power supply (VDD) is turned OFF. In this power off period, the resistance (data M) is retained. In a configuration of a non-volatile flip-flop using a resistive memory element, a backup operation of the resistive memory element is performed to prevent data loss due to power off.

(Reading Operation)

(At Point of Time E) The point E in FIG. 8 indicates a time at which power supply is changed from OFF to ON and the data stored in the memory element is read. FIG. 11 illustrates the operation status at this point of time.

At that time, the enable signal EN is "low" and the backup signal is "Low".

Transistors 30a, 30b, and 31 is turned ON by rising a read control signal RCL and a monitor control signal SE. Because the resistance of the memory element 11 (data M) is high, a "High" output signal A is output from the output means 30. Receiving the "High" output signal A and a "Low" write signal Y, the writing-termination detection unit 41 output a "Low" writing-termination detection signal DONE. Receiving the writing-termination detection signal DONE, a transistor 42b of the writing-termination signal generation unit 42 is OFF; however, a transistor 42d is turned ON by an inversion signal of the backup signal, which retains a writing-termination signal WE "Low".

Backup Operation Status 2

A timing chart of FIG. 12 illustrates a normal operation, a backup operation, and a power-off period, in which data before writing is the same as data after writing, or the data is not rewritten. The normal operation indicates an operation without data-writing; the backup operation indicates an operation to write data and to monitor data-writing; and the power off period indicates a period during which no power is supplied to a memory element.

FIG. 12(a) illustrates a power supply VDD. FIG. 12(b) illustrates a clock CLK. FIG. 12(c) illustrates an enable signal EN to enable a normal operation. FIG. 12(d) illustrates a data signal Nq. FIG. 12(e) illustrates a backup signal BCK to enable a backup operation. FIG. 12(f) illustrates a NAND output from a control unit 22. FIG. 12(g) illustrates a write signal Y output from the control unit 22. FIG. 12(h) illustrates a memory status of a memory element 11. FIG. 12(i) illustrates output signals A (a read signal VRD and a monitor signal VM) from an output means 30. FIG. 12(j) illustrates a writing-termination detection signal DONE to detect a termination of data-writing into the memory element. FIG. 12(k) illustrates a writing-termination signal WE to terminate a write current. FIG. 12(l) illustrates backup starting control signal STR to start a backup operation. FIG. 12(m) illustrates a current IWR to write data into the memory element. FIG. 12(n) illustrates a monitor control signal SE to enable a monitor operation.

(Normal Operation)

In the normal operation, an enable signal EN is "High"; and data is not written into the memory element. Here, a resistance of the memory element 11 is "High" according to the status of the timing chart of FIG. 8; a write signal Y and an output signal A are "Low"; a writing-termination detection signal DONE is "Low"; and a data signal Nq retains "High".

(Backup Operation)

FIG. 13 and FIG. 14 illustrate operation examples of a writing means 20, an output means 30, and a control means 40 in a backup operation.

(At Point of Time F) The point F in FIG. 12 indicates a time at which a normal operation is changed to a backup operation. FIG. 13 illustrates an operation status at this point.

A data-writing operation is started by changing an enable signal EN from "High" to "Low". A backup operation is started by changing a backup signal BCK from "Low" to "High".

A backup signal BCK and a data signal Nq are input to a NAND 22a. Transition of the backup signal BCK changes a NAND output to "Low" and a write signal Y is output from an inverter 22b. An inversion signal of the backup signal BCK transits to "High" in the control means 40, which turns ON a transistor 42d, transits a writing-termination signal WE to "High", and enables a writing operation.

Respective transistors 21Aa and 21Ba of driving means 21A and 21B are turned ON from OFF by a writing-termination signal WE from the output means 30. A write current IWR is supplied to a conductive electrode 13 of a resistive memory element 10.

Transistors 30a and 30b of the output means 30 are ON. A transistor 31 is switched to ON by rising a monitor control signal SE. Because the resistance is high, an output signal A is "High".

A write signal Y and an output signal A are "High". Accordingly, a writing-termination detection signal DONE and a writing-termination signal WE are turned "High"; and a writing termination control is not performed.

At that time, receiving the "High" writing-termination detection signal DONE, a control means falls a backup starting control signal STR.

(At Point of Time G) The point G in FIG. 12 indicates a time at a writing termination in a backup operation. FIG. 13 illustrates the operation status at this point of time.

At that time, a write signal Y and an output signal A are "High"; and a writing-termination detection signal DONE is also "High". Receiving the writing-termination detection signal DONE, the control unit causes a backup starting control signal STR to fall; accordingly, a writing-termination signal WE transits from "High" to "Low" to control a writing termination. A write current IWR is terminated in one cycle. In this operation, if the memory status of the memory element is the same as memory status corresponding to data to be written, the writing operation will be substantially skipped.

(Configuration of Non-Volatile Flip-Flop)

Next, configuration examples of a non-volatile flip-flop using a data write device for a resistive memory element of the present invention will be described with reference to FIGS. 15 to 18.

Here, a master latch and a slave latch are cascaded; a data write device for a resistive memory element of the present invention is provided at the master latch side; and the slave latch includes a normal CMOS.

Figure 15:
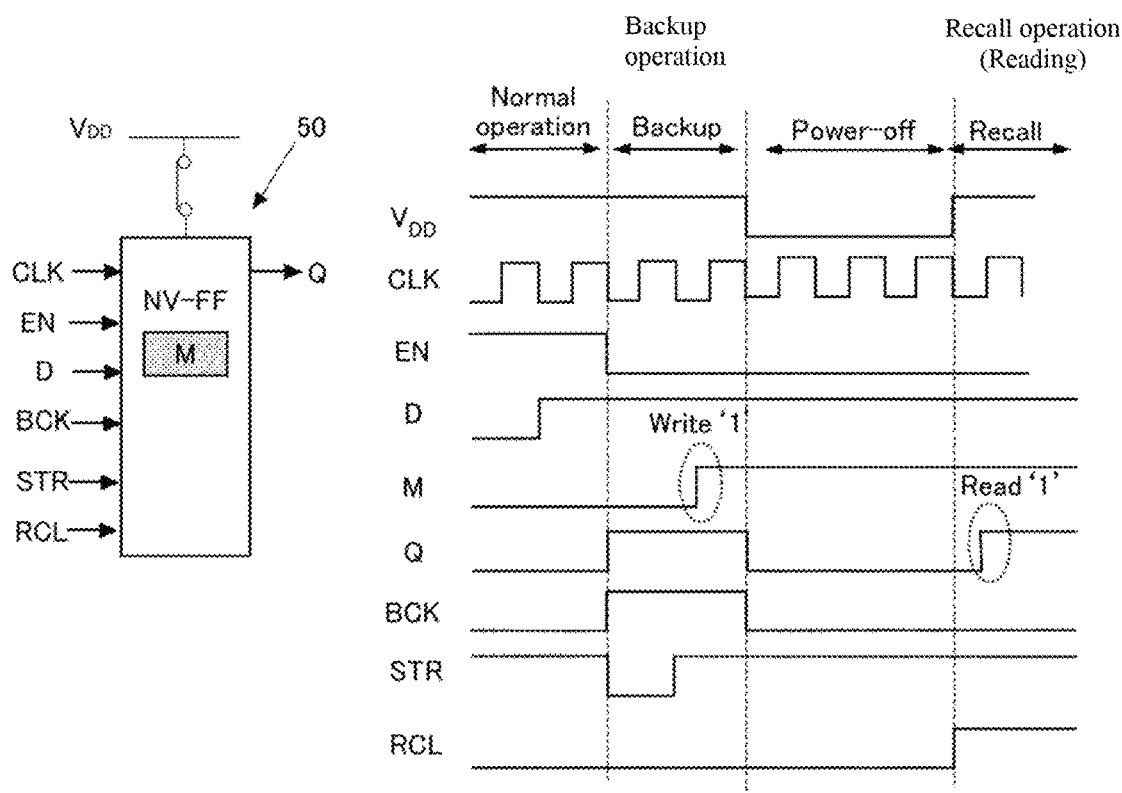
FIG. 15 is a schematic diagram illustrating a configuration of a non-volatile flip-flop including a data write device for a resistive memory element of the present invention and also illustrating an operation timing chart of the non-volatile flip-flop.

In FIG. 15, a non-volatile flip-flop (NV-FF) 50 of the present invention includes a resistive memory element, inputs data D, and outputs an output Q at a timing of a clock CLK. The clock CLK, an enable signal EN, data D, a backup signal BCK, a backup starting control signal STR, and a read control signal RCL in FIG. 15 are respectively similar to those described in a data write device for a resistive memory element; M indicates a resistance state of the resistive memory element.

Similarly, reference signs in a timing chart of FIG. 15 are the same as those in timing charts in FIGS. 8 and 12 illustrating a data write device for a resistive memory element. Data D is input in a normal operation, memorized as a resistance state in a backup operation and output as an output Q, and output as an output Q in a reading operation (recall operation).

Figure 16:
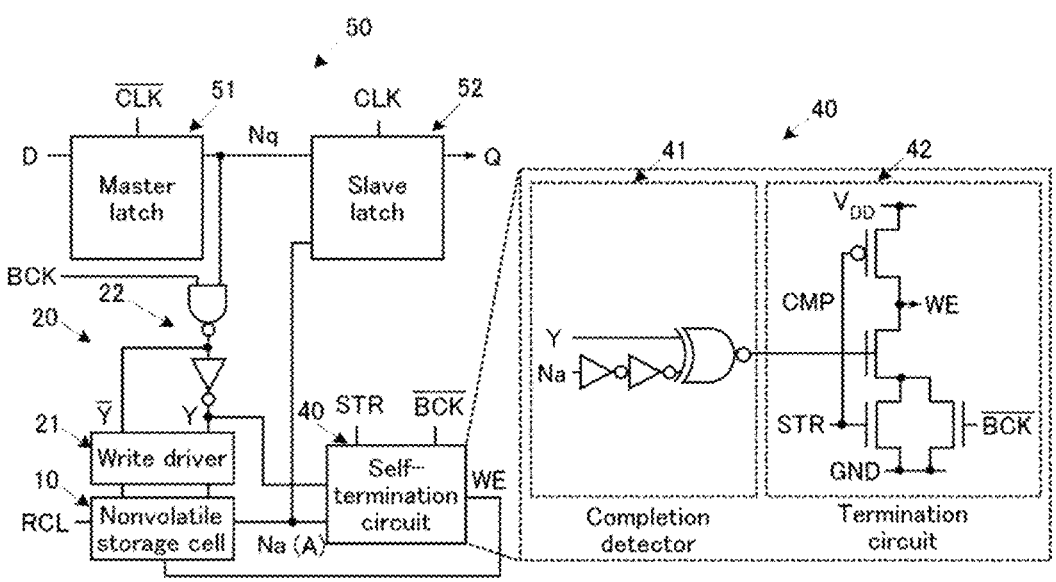
FIG. 16 is a diagram illustrating a configuration example of a non-volatile flip-flop including a data write device for a resistive memory element of the present invention.

FIG. 16 is a diagram illustrating a configuration example of a non-volatile flip-flop (NV-FF) 50. The non-volatile flip-flop (NV-FF) 50 is configured to cascade a master latch 51 and a slave latch 52.

The master latch 51 inputs data D and outputs a data signal Nq to the slave latch 52 with synchronization to the clock CLK. The master latch 51 memorizes the data signal Nq of the data D into a memory element 11 in a resistive memory element 10 by the above-described data write device for a resistive memory element.

Figure 5:
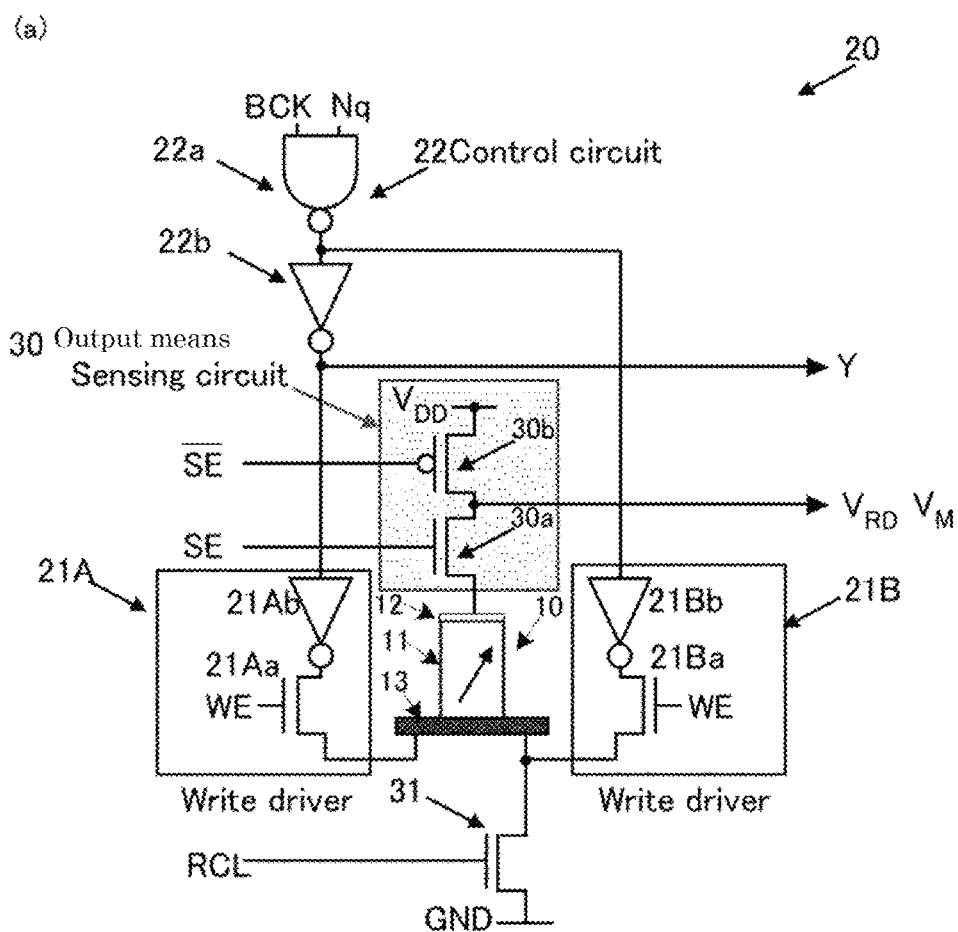
FIG. 5 is a diagram illustrating a writing means and an output means of the present invention.
Figure 5:
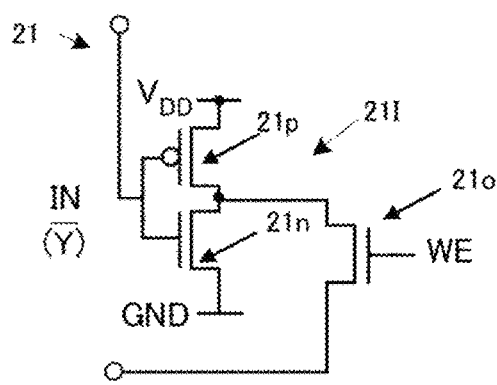

The non-volatile flip-flop (NV-FF) 50 illustrated in a configuration example of FIG. 16 has a similar configuration to FIG. 5. Specifically, it includes a resistive memory element 10, writing means 20 (a driving means or a write driver 21, a control unit 22), and a control means 40. A similar configuration to FIG. 7, the control means 40 includes a writing-termination detection unit 41 and a writing-termination signal generation unit 42.

(Comparison of Power Consumption)

Next, comparison examples of power consumption in a configuration of the present invention and conventional configurations will be described.

A non-volatile flip-flop of the present invention uses a resistive memory element having parameters shown in Table 1 below. The non-volatile flip-flop of the present invention is designed on 90 nm-rule.

TABLE 1

| Design parameters | | | |
|---|---|---|---|
| $R_0$ | $R_1$ | $I_{W0}$ | $I_{W1}$ |
| 8 kΩ | 24 kΩ | −0.08 mA | 0.08 mA |

Figure 17:
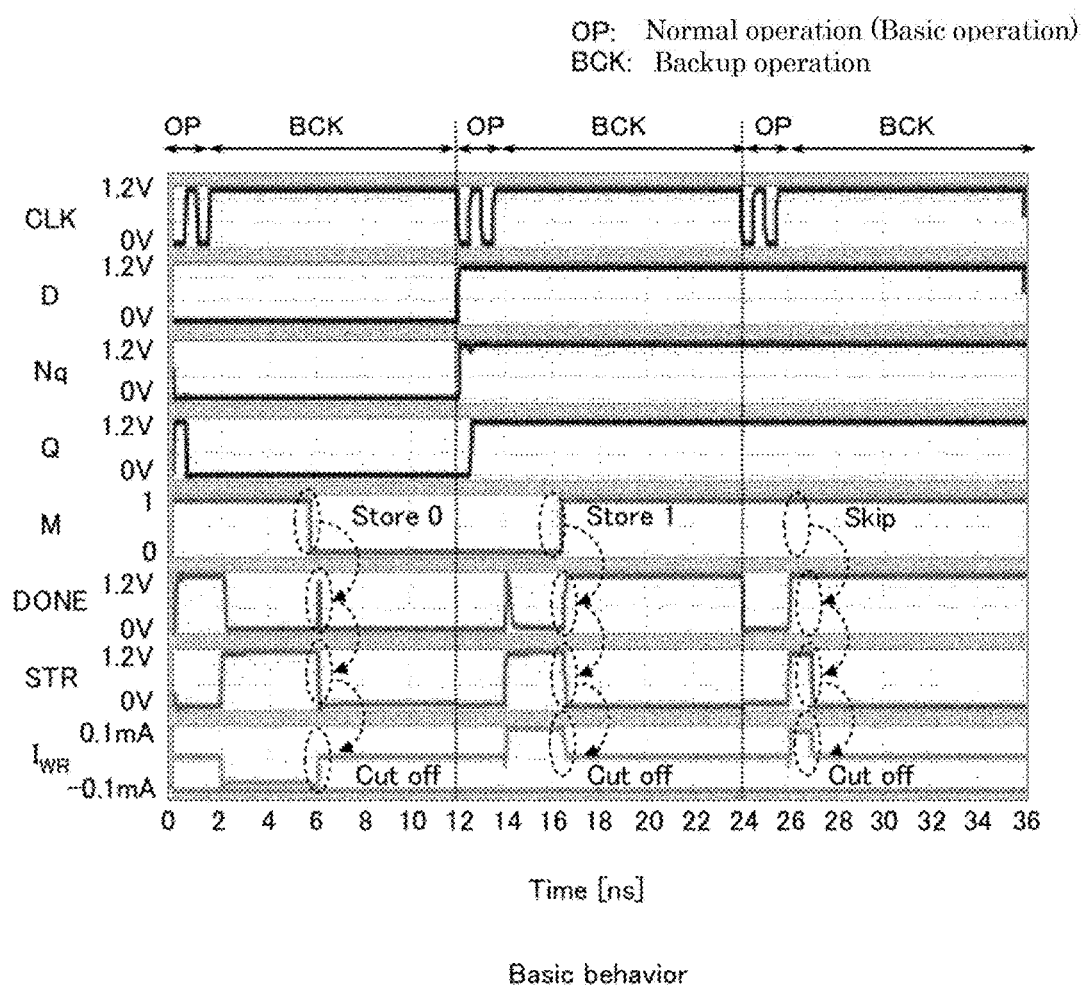
FIG. 17 is a diagram illustrating a signal example of an embodiment of a non-volatile flip-flop of the present invention.

FIG. 17 is an example of signals in an embodiment of a non-volatile flip-flop. A section from 0 ns to 12 ns and a section from 12 ns to 24 ns correspond to the above-described operation status 1 while a section from 24 ns to 36 ns corresponds to the above-described operation status 2.

According to FIG. 17, a data-writing and a termination-process of a write current after data-writing are observed. When Nq is equal to M in the memory element, skipping a writing process is observed.

Table 2 below shows power consumption [μW], delay time [ps], and PDP [μW*ps] (a product of power consumption μW and delay time ps) of a CMOS flip-flop, a flip-flop configured to use a resistive memory element of the preset invention without self-termination of a write current (Non-patent literature 1, described as Ref. [31] in Table 2), a flip-flop configured to use a conventional resistive memory element with self-termination of a write current (Non-patent literature 2, described as Ref. [19] in Table 2), and a flip-flop according to the present invention.

TABLE 2

| Performance comparisons | | | | |
|---|---|---|---|---|
|  | CMOS | Ref. [31] | Ref. [19] | Proposed |
| Nonvolatile | No | Yes (3T-MTJ) | Yes (2T-MTJ) | Yes (3T-MTJ) |
| Self-termination | No | No | Yes | Yes |
| Transistor counts*[1] | 16 | 23 | 46 | 47 |
| Active power [μW]*[1,2,3] | 6.69 | 10.0 | 8.54 | 8.05 |
| Delay [ps]*[1,2,4] | 59.7 | 67.9 | 64.1 | 59.7 |
| PDP [μW*ps]*[5] | 399 | 679 | 522 | 480 |

*[1])Input buffer, output buffer, and clock buffer are not included.
*[2])90 nm CMOS technology ($V_{DD}$ = 1.2 V).
*[3])Average power during normal operation at 1.0 GHz.
*[4])Maximum time from $V_{CLK}$ crossing 50% to $V_Q$ crossing 50%.
*[5])PDP: Power-delay product.

In above Table 2, each row indicates volatile or non-volatile (No and Yes respectively mean volatile and non-volatile), automatic writing-termination or not (No and Yes respectively mean not automatic and automatic), the number of transistor, power consumption (μW), delay time (ps), and PDP (μW*ps: a product of power consumption μW and delay time ps).

Note 1 (*1) indicates exclusion of an input buffer, an output buffer, and a clock buffer. Note 2 (*2) indicates a CMOS with power supply voltage VDD of 1.2 V and 90 nm scale. Note 3 (*3) indicates power consumption during a normal operation of 1.0 GHz. Note 4 (*4) indicates a maximum time from a voltage VCLK of a clock CLK exceeding 50% to an output Q voltage VQ exceeding 50%. Note 5 (*5) indicates a PDP (a product of power consumption μW and delay time ps).

The comparison shows a PDP, a product of power consumption μW and delay time ps, is reduced compared with that in other configurations.

Those embodiments of flip-flop evaluate an 8-bit NV-FF. Regarding the variation of switching time, the average switching time is 5 ns and the standard deviation is 10%. The most dispersed switching time is 12 ns and the standard deviation is 12%.

Figure 18:
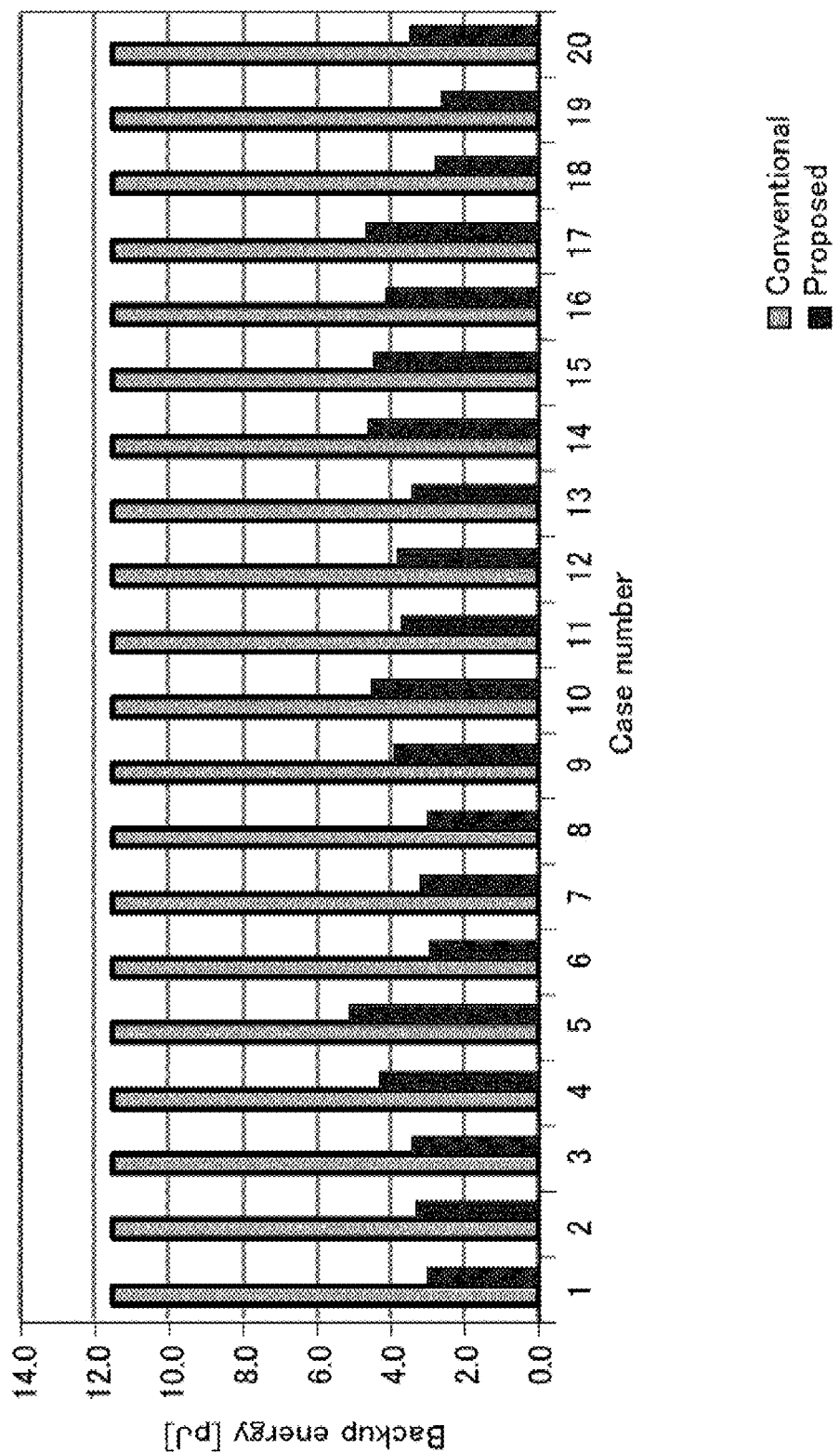
FIG. 18 is a timing chart of an operation example of a data write device for a resistive memory element of the present invention.

FIG. 18 illustrates a comparison of power consumption of a resistive memory element of the present invention when a backup operation is repeated twenty times. The graph compares a configuration of the present invention in which an automatic termination of a write current is performed (shown in dark-shaded parts of FIG. 18) with a configuration in which an automatic termination of a write current is not performed (shown in shaded parts of FIG. 18).

FIG. 18 shows power consumption at backup operation has been sufficiently reduced.

Figure 20:
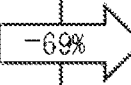
FIG. 20 is Table 3 showing a comparison of the average backup energy when the backup operation is repeated a hundred times in a conventional configuration with that in a configuration of the present invention.

Table 3, shown in FIG. 20, compares the average of backup energy when the backup operation is repeated a hundred times in a conventional configuration with that in a configuration of the present invention. The comparison shows that a backup energy is reduced by 69% in the configuration according to the present invention.

Note 1 (*1) in Table 3 indicates that the number of iterations is one hundred. Note 2 (*2) in Table 3 indicates that random patterns are input. Note 3 (*3) in Table 3 indicates that the width of the write pulse is 12 ns.

The present invention is not limited to the above-described embodiments but can be variously modified on the basis of the purpose of the present invention. All such modifications are within the scope of the present invention.

INDUSTRIAL APPLICABILITY

A data write device for a resistive memory element of the present invention can be adapted to a flip-flop, a logic element in a non-volatile memory device, and others.

REFERENCE SIGNS LIST

1 Data write device for a resistive memory element
10, 10A, 10B, 10C, 10D Resistive memory element
10a Conductive layer
10b Magnetization fixed layer
10c Tunnel barrier layer
10d Magnetization free layer
10e, 10f, 10g Terminal
10h, 10i Spin source
10j Domain wall
10k Heavy metal layer
10l Recording layer
10m Barrier layer
10n Reference layer
11 Memory element
12 Reading electrode
13 Conductive electrode
20 Writing means
21, 21A, 21B Driving means
21Aa, 21Ba Transistor
21Ab, 21Bb Invertor
22 Control unit
22a NAND circuit
22b Invertor
30 Output means
30a Transistor
30b Transistor
40 Control means
41 Writing-termination detection unit
41a Exclusive NOR
41b, 41c Invertor
42 Writing-termination signal generation unit
42a, 42b, 42c, 42d Transistor
51 Master latch
52 Slave latch
100 Write device
110 Resistive memory element
111 Memory element
120 Monitor unit
120A Writing means
120Aa Transistor
120Ab Write driver
120B Writing means
120Ba Transistor
120Bb Write driver
121 Multiplexer
130 Reading unit
130a NMOS transistor
130b PMOS transistor
BCK Backup signal
CLK Clock
D Data
DONE Writing-termination detection signal
EN Enable signal
GND Grounding voltage
IM Monitor current
IR Read current
IW0, IW1, IW2 Write current
IWR Write current
M Data
Nq Data signal
Q Output
R0 Low resistance
R1 High resistance
RCL Read control signal
RM Resistance
SE Monitor control signal
STR Backup starting control signal
T1, T2, T3 Terminal
VBL Write signal
VDD Power supply voltage
VM Monitor signal
VRD Read signal
WE Writing-termination signal

The invention claimed is:

1. A data write device comprising:
a resistive memory element including a conductive electrode, a memory element, and a reading electrode, the conductive electrode being provided at one end of the memory element and the reading electrode being provided at another end of the memory element;
a writing means for writing data into the memory element, the writing means including a driving means for switching a direction of a write current applied to the conductive electrode to vary a resistance of the resistive memory element to write the data into memory element and for stopping applying of the write current to the conductive electrode;
an output means for outputting a read signal from the memory element and a monitor signal for monitoring a status of the memory element being written to by the writing means, the output means being provided between a power source and the reading electrode; and
a control means for controlling the driving means based on the monitor signal from the output means when writing the data into the memory element.

2. The data write device according to claim 1, wherein the control means comprises:
a writing-termination detection unit being configured to output a writing-termination detection signal based on a write signal from the writing means and the monitor signal showing a writing status of the output means; and
a writing-termination signal generation unit being configured to output a writing-termination signal based on the writing-termination detection signal from the writing-termination detection unit.

3. The data write device according to claim 1, wherein the output means comprises a series circuit of a PMOS transistor and an NMOS transistor,
the power source being connected to a source of the PMOS transistor,
the reading electrode being connected to a source of the NMOS transistor,
a connection node of a drain of the PMOS transistor and a drain of the NMOS transistor being configured to be an output end to output the read signal and the monitor signal.

4. The data write device according to claim 1, wherein the driving means comprises:
a first NMOS transistor, a source of the first NMOS transistor being connected to one end of the conductive electrode, a drain of the first NMOS transistor being connected to a write current source side; and second NMOS transistor, a source of the second NMOS transistor being connected to the other end of the conductive electrode, a drain of the second NMOS transistor being connected to a write current source side via an inverter, wherein the writing-termination signal from the control means is configured to be input to a gate of the first NMOS transistor and a gate of the second NMOS transistor.

5. A non-volatile flip-flop, comprising:

a master latch; and, a slave latch cascaded to the master latch, wherein the master latch comprises:

a resistive memory element including a conductive electrode, a memory element, and a reading electrode, the conductive electrode being provided at one end of the memory element and the reading electrode being provided at another end of the memory element;

a writing means for writing data into the memory element, the writing means including a driving means for switching a direction of a write current applied to the conductive electrode to vary a resistance of the resistive memory element to write the data into memory element and for stopping applying of the write current to the conductive electrode;

an output means for outputting a read signal from the memory element and a monitor signal for monitoring a status of the memory element being written to by the writing means, the output means being provided between a power source and the reading electrode; and a control means for controlling the driving means based on the monitor signal from the output means when writing the data into the memory element.

* * * * *